(12) United States Patent
Takahashi et al.

(10) Patent No.: US 11,578,927 B2
(45) Date of Patent: Feb. 14, 2023

(54) VAPOR CHAMBER, ELECTRONIC DEVICE, METALLIC SHEET FOR VAPOR CHAMBER AND MANUFACTURING METHOD OF VAPOR CHAMBER

(71) Applicant: DAI NIPPON PRINTING CO., LTD., Tokyo-to (JP)

(72) Inventors: Shinichiro Takahashi, Tokyo-to (JP); Kenro Hirata, Tokyo-to (JP); Takayuki Ota, Tokyo-to (JP); Taizo Hashimoto, Tokyo-to (JP); Kiyotaka Takematsu, Tokyo-to (JP)

(73) Assignee: DAI NIPPON PRINTING CO., LTD., Tokyo (JP)

( * ) Notice: Subject to any disclaimer, the term of this patent is extended or adjusted under 35 U.S.C. 154(b) by 0 days.

(21) Appl. No.: 16/488,843

(22) PCT Filed: Feb. 23, 2018

(86) PCT No.: PCT/JP2018/006758
§ 371 (c)(1),
(2) Date: Aug. 26, 2019

(87) PCT Pub. No.: WO2018/155641
PCT Pub. Date: Aug. 30, 2018

(65) Prior Publication Data
US 2020/0025458 A1 Jan. 23, 2020

(30) Foreign Application Priority Data

Feb. 24, 2017 (JP) .............................. JP2017-033622
Nov. 10, 2017 (JP) .............................. JP2017-217593
Nov. 10, 2017 (JP) .............................. JP2017-217633

(51) Int. Cl.
*F28D 15/02* (2006.01)
*F28D 15/04* (2006.01)
(Continued)

(52) U.S. Cl.
CPC ..... *F28D 15/0233* (2013.01); *F28D 15/0266* (2013.01); *F28D 15/046* (2013.01); *H01L 23/427* (2013.01); *H05K 7/20309* (2013.01)

(58) Field of Classification Search
CPC ............ F28D 15/0233; F28D 15/0266; F28D 15/046; H01L 23/427; H05K 7/20309
See application file for complete search history.

(56) References Cited

U.S. PATENT DOCUMENTS

| 9,568,965 B2 * | 2/2017 | Honmura .............. H04M 1/026 |
| 2005/0022978 A1 * | 2/2005 | Duval ................. F28D 15/0233 |
| | | 165/104.26 |

(Continued)

FOREIGN PATENT DOCUMENTS

| CN | 101047045 A | 10/2007 |
| CN | 101119625 A | 2/2008 |

(Continued)

OTHER PUBLICATIONS

Nov. 20, 2020 Office Action issued in Taiwanese Patent Application No. 107106230.

(Continued)

*Primary Examiner* — Devon Russell
(74) *Attorney, Agent, or Firm* — Oliff PLC

(57) ABSTRACT

A liquid flow path portion of a vapor chamber according to this invention includes a first main flow groove, a second main flow groove and a third main flow groove. A first convex array including a plurality of first convex portions arranged via a first communicating groove is provided between the first main flow groove and the second main flow groove. A second convex array including a plurality of second convex portions arranged via a second communicating groove is provided between the second main flow groove and the third main flow groove. The main flow groove includes a first intersection at which at least a part of the first (Continued)

communicating groove faces each second convex portion and a second intersection at which at least a part of the second communicating groove faces each first convex portion.

16 Claims, 13 Drawing Sheets

(51) Int. Cl.
*H05K 7/20* (2006.01)
*H01L 23/427* (2006.01)

(56) References Cited

U.S. PATENT DOCUMENTS

| | | | |
|---|---|---|---|
| 2006/0144565 | A1 | 7/2006 | Tsai et al. |
| 2007/0068657 | A1* | 3/2007 | Yamamoto ......... H05K 7/20336 165/104.26 |
| 2007/0227704 | A1 | 10/2007 | Nagai et al. |
| 2008/0029251 | A1 | 2/2008 | Nakajima et al. |
| 2008/0216994 | A1 | 9/2008 | Lee |
| 2010/0018676 | A1 | 1/2010 | Yang et al. |
| 2014/0311713 | A1 | 10/2014 | Wu et al. |
| 2015/0077929 | A1* | 3/2015 | Honmura ............... F28D 15/046 361/679.52 |
| 2017/0023307 | A1* | 1/2017 | Wang .................... F28D 15/046 |
| 2017/0023308 | A1* | 1/2017 | Huang ................ F28D 15/0233 |

FOREIGN PATENT DOCUMENTS

| | | |
|---|---|---|
| CN | 102778156 A | 11/2012 |
| CN | 203687721 U | 7/2014 |
| JP | S58-012991 A | 1/1983 |
| JP | S62-156273 U | 10/1987 |
| JP | H03-186195 A | 8/1991 |
| JP | H03-271695 A | 12/1991 |
| JP | H04-32695 A | 2/1992 |
| JP | H10-185465 A | 7/1998 |
| JP | 2002-323292 A | 11/2002 |
| JP | 2004-309002 A | 11/2004 |
| JP | 2007-212028 A | 8/2007 |
| JP | 2007-266153 A | 10/2007 |
| JP | 2007-315745 A | 12/2007 |
| JP | 2010-19495 A | 1/2010 |
| JP | 2011-145044 A | 7/2011 |
| JP | 2011-226686 A | 11/2011 |
| JP | 2014-142143 A | 8/2014 |
| JP | 2015-059693 A | 3/2015 |
| JP | 2015-088882 A | 5/2015 |
| JP | 2015-219639 A | 12/2015 |
| JP | 2016-017702 A | 2/2016 |
| JP | 2016-050682 A | 4/2016 |
| JP | 2016-205693 A | 12/2016 |
| KR | 10-2009-0059449 A | 6/2009 |
| WO | 2017/203574 A1 | 11/2017 |
| WO | 2018/155641 A1 | 8/2018 |

OTHER PUBLICATIONS

Sep. 18, 2020 Office Action issued in Japanese Patent Application No. 2020-142964.
Jul. 28, 2020 Office Action issued in Japanese Patent Application No. 2018-186079.
Apr. 3, 2020 Office Action issued in Japanese Patent Application No. 2018-534996.
Apr. 20, 2020 Office Action issued in Chinese Patent Application No. 201880013745.8.
May 1, 2018 International Search Report issued in International Patent Application No. PCT/JP2018/006758.
Dec. 25, 2018 International Search Report issued in International Patent Application No. PCT/JP2018/036261.
Sep. 4, 2020 Office Action issued in Japanese Patent Application No. 2018-534996.
Mar. 31, 2020 International Preliminary Report on Patentability issued in International Patent Application No. PCT/JP2018/036261.
U.S. Appl. No. 16/651,565, filed Mar. 27, 2020 in the name of Takahashi et al.
Sep. 11, 2020 Office Action issued in Japanese Patent Application No. 2018-186079.
Aug. 27, 2019 International Preliminary Report on Patentability issued in International Patent Application No. PCT/JP2018/006758.
Sep. 4, 2020 Office Action issued in Chinese Patent Application No. 201880013745.8.
Jun. 4, 2021 Office Action issued in Chinese Patent Application No. 201880076012.9.
Jul. 16, 2021 Office Action issued in Taiwanese Patent Application No. 107134333.
Sep. 3, 2021 Office Action issued in Japanese Patent Application 2020-198796.
Sep. 2, 2021 Office Action issued in Chinese Patent Application No. 202011619911.4.
Dec. 28, 2021 Office Action issued in Korean Application No. 10-2019-7024492.
Feb. 16, 2022 Office Action issued in Chinese Application No. 202011619911.4.
Feb. 28, 2022 Office Action issued in Chinese Application No. 201880076012.9.
Mar. 29, 2022 Office Action issued in Korean Application No. 2020-7011818.
Mar. 28, 2022 Office Action issued in Taiwanese Application No. 110125873.
Jun. 14, 2002 Office Action issued in Japanese Application No. 2018-186081.
Jun. 14, 2002 Office Action issued in Japanese Application No. 2018-186084.
Jul. 1, 2022 Office Action issued in Japanese Application No. 2018-186121.
Jul. 5, 2022 Office Action issued in Japanese Application No. 2018-186082.
Aug. 1, 2022 Office Action issued in Chinese Patent Application No. 202110492700.7.
Sep. 20, 2022 Office Action issued in Chinese Patent Application No. 201880076012.9.
Sep. 2, 2022 Office Action issued in Japanese Patent Application No. 2021-163743.
Nov. 25, 2022 Office Action issued in Korean Patent Application No. 10-2020-7011818.
Nov. 1, 2022 Office Action issued in Japanese Patent Application No. 2021-211601.
Sep. 29, 2022 Office Action issued in Korean Patent Application No. 10-2022-7030577.

* cited by examiner

VAPOR CHAMBER, ELECTRONIC DEVICE, METALLIC SHEET FOR VAPOR CHAMBER AND MANUFACTURING METHOD OF VAPOR CHAMBER

TECHNICAL FIELD

The present invention relates to a vapor chamber including a sealed space in which a working fluid is enclosed, an electronic device, a metallic sheet for the vapor chamber and a manufacturing method of the vapor chamber.

BACKGROUND ART

A device accompanied with heat generation such as a central processing unit (CPU), a light-emitting diode (LED) and a power semiconductor, which is used in a mobile terminal and the like including a portable terminal or a tablet terminal, is cooled by a heat release member such as a heat pipe (for example, see Patent Literatures 1 to 5.) In recent years, to make a mobile terminal etc. thinner, thickness reduction of the heat release member has been requested, and development has been advanced for a vapor chamber which can be thinner than the heat pipe. In the vapor chamber, a working fluid is enclosed, and the working fluid absorbs heat in the device and releases the heat to the outside, whereby the device is cooled.

More specifically, the working fluid in the vapor chamber evaporates to turn into a vapor by receiving heat from the device at a portion close to the device (an evaporating portion.) After that, the vapor moves to a position away from the evaporating portion, and is cooled and liquidized by condensation. In the vapor chamber, a liquid flow path portion as a capillary structure (wick) is provided, and the working fluid in liquid form is transported toward the evaporating portion by passing through the liquid flow path portion, and at the evaporating portion, receives the heat again to evaporate. In this way, the working fluid transfers the heat of the device by circulating in the vapor chamber while executing a change of phase, that is, repeating evaporation and condensation, which improves heat release efficiency.

Incidentally, the liquid flow path portion includes a plurality of grooves extending in a first direction. The working fluid obtains thrust toward the evaporating portion by receiving capillary action, and passes through the grooves toward the evaporating portion. Also, to reciprocate the working fluid in the grooves adjacent to each other, another groove extending in a second direction orthogonal the first direction is provided. In this way, in the liquid flow path portion, a plurality of grooves are formed to be lattice-shaped, whereby the working fluid is evenly distributed in the liquid flow path portion.

Patent Literature 1

Japanese Patent Laid-Open No. 2015-59693

Patent Literature 2

Japanese Patent Laid-Open No. 2015-88882

Patent Literature 3

Japanese Patent Laid-Open No. 2016-17702

Patent Literature 4

Japanese Patent Laid-Open No. 2016-50682

Patent Literature 5

Japanese Patent Laid-Open No. 2016-205693

DISCLOSURE OF THE INVENTION

However, when a plurality of grooves are formed in a lattice shape, a problem can occur due to a pressure received from the outside air.

That is, the vapor chamber is constituted by two metallic sheets, and the above-described grooves are formed on at least one metallic sheet. Thereby, in a portion where the grooves are formed in the metallic sheet, a thickness of a metal material becomes small. Since a space in the liquid flow path portion is depressurized, the metallic sheet receives a pressure in a direction of being recessed inwardly from outside air. Consequently, the metallic sheet has a risk of being recessed inwardly along the grooves. In particular, when thickness reduction of the vapor chamber is requested as described above, the thickness of metallic sheets become smaller, and recess can be easily generated.

At an intersection at which the grooves orthogonal to each other intersect, when the metallic sheet is recessed along the grooves extending in the second direction, the corresponding recess traversing the grooves along the first direction can be formed. In such a case, a cross-sectional area of a flow path of the grooves along the first direction is reduced, which can increase flow path resistance of the working fluid. This reduces a transport function of the working fluid in liquid form toward the evaporating portion, and the supply amount of the working fluid to the evaporating portion can be reduced. In such a case, such a problem occurs that the amount of heat transport from the evaporating portion is reduced, and thermal transport efficiency is lowered.

The present invention is made considering this point, and an object of the present invention is to provide a vapor chamber which secures the cross-sectional area of the flow path of the liquid flow path portion to improve the transport function of the working fluid in liquid form and improves the thermal transport efficiency, an electronic device, a metallic sheet for the vapor chamber and a manufacturing method of the vapor chamber.

This invention provides a vapor chamber in which a working fluid is enclosed, the vapor chamber including:

a first metallic sheet;

a second metallic sheet provided on the first metallic sheet; and a sealed space which is provided between the first metallic sheet and the second metallic sheet and which includes a vapor flow path portion through which a vapor of the working fluid passes and a liquid flow path portion through which the working fluid in liquid form passes, wherein the liquid flow path portion is provided in a surface of the first metallic sheet on a side of the second metallic sheet, the liquid flow path portion includes a first main flow groove, a second main flow groove and a third main flow groove, each of which extends in a first direction and through which the working fluid in liquid form passes, the first main flow groove, the second main flow groove and the third main flow groove are arranged in this order in a second direction orthogonal to the first direction, a first convex array which includes a plurality of first convex portions arranged in the first direction via a first communicating groove is provided between the first main flow groove and the second main flow groove, a second convex array which includes a plurality of second convex portions arranged in the first direction via a second communicating groove is provided between the second main flow groove and the third main flow groove, the first communicating groove allows communication between the first main flow groove and the second main flow groove, the second communicating groove allows communication between the second main flow groove and the third main flow groove, and the second main flow groove includes a first intersection at which at least a part of the first communicating groove faces each second convex portion and a second intersection at which at least a part of the second communicating groove faces each first convex portion.

Additionally, in the vapor chamber described above, it is acceptable that the first intersection and the second intersection of the second main flow groove are adjacent to each other.

Additionally, in the vapor chamber described above, it is acceptable that the second main flow groove includes a plurality of the first intersections and a plurality of the second intersections, and the first intersections and the second intersections of the second main flow groove are alternately arranged.

Additionally, in the vapor chamber described above, it is acceptable that the liquid flow path portion further includes a fourth main flow groove which extends in the first direction and through which the working fluid in liquid form passes, the fourth main flow groove is arranged on an opposite side from the second main flow groove to the third main flow groove, a third convex array which includes a plurality of third convex portions arranged in the first direction via a third communicating groove is provided between the third main flow groove and the fourth main flow groove, the third communicating groove allows communication between the third main flow groove and the fourth main flow groove, and the third main flow groove includes a first intersection at which at least a part of the second communicating groove faces each third convex portion and a second intersection at which at least a part of the third communicating groove faces each second convex portion.

Additionally, in the vapor chamber described above, it is acceptable that the first intersection and the second intersection of the third main flow groove are adjacent to each other.

Additionally, in the vapor chamber described above, it is acceptable that the third main flow groove includes a plurality of the first intersections and a plurality of the second intersections, and the first intersections and the second intersections of the third main flow groove are alternately arranged.

Additionally, in the vapor chamber described above, it is acceptable that the second metallic sheet includes a planar abutting surface which abuts a surface of the first metallic sheet on a side of the second metallic sheet and covers the second main flow groove.

Additionally, in the vapor chamber described above, it is acceptable that a width of the second main flow groove is larger than a width of the first convex portions and a width of the second convex portions.

Additionally, in the vapor chamber described above, it is acceptable that a width of the first communicating groove is larger than a width of the first main flow groove and the width of the second main flow groove, and a width of the second communicating groove is larger than the width of the second main flow groove and a width of the third main flow groove.

Additionally, in the vapor chamber described above, it is acceptable that a depth of the first communicating groove is deeper than a depth of the first main flow groove and a depth of the second main flow groove, and a depth of the second communicating groove is deeper than the depth of the second main flow groove and a depth of the third main flow groove.

Additionally, in the vapor chamber described above, it is acceptable that a depth of the first intersection and a depth of the second intersection of the second main flow groove are deeper than a depth of a portion between the first convex portions and the second convex portions adjacent to each other in the second main flow groove.

Additionally, in the vapor chamber described above, it is acceptable that the depth of the first intersection and the depth of the second intersection of the second main flow groove are deeper than the depth of the first communicating groove and the depth of the second communicating groove.

Additionally, in the vapor chamber described above, it is acceptable that each first convex portion includes a pair of first convex end portions provided at both end portions in the first direction and a first convex intermediate portion provided between the pair of first convex end portions, and a width of the first convex intermediate portion is smaller than a width of the first convex end portions.

Additionally, in the vapor chamber described above, it is acceptable that a rounded curved portion is provided at a corner portion of each first convex portion.

Additionally, in the vapor chamber described above, it is acceptable that the second metallic sheet includes a plurality of main flow groove convex portions, each of which protrudes toward the first main flow groove, the second main flow groove and the third main flow groove of the first metallic sheet from a surface of the second metallic sheet on a side of the first metallic sheet.

Additionally, in the vapor chamber described above, it is acceptable that a cross section of each main flow groove convex portion is formed to be curved.

Additionally, in the vapor chamber described above, it is acceptable that the second metallic sheet includes a plurality of communicating groove convex portions, each of which protrudes toward the first communicating groove and the second communicating groove of the first metallic sheet from the surface of the second metallic sheet on a side of the first metallic sheet.

Additionally, in the vapor chamber described above, it is acceptable that a cross section of each communicating groove convex portion is formed to be curved.

Also, the present invention provides an electronic device including:
a housing;
a device housed in the housing; and
a vapor chamber as described above, the vapor chamber is thermally contacted to the device.

Also, the present invention provides a metallic sheet for a vapor chamber used for the vapor chamber including a sealed space which includes a vapor flow path portion in which a working fluid is enclosed and through which a vapor of the working fluid passes and a liquid flow path portion through which the working fluid in liquid form passes, the metallic sheet for a vapor chamber including:

a first surface; and a second surface provided on an opposite side from the first surface, wherein the liquid flow path portion is provided to the first surface, the liquid flow path portion includes a first main flow groove, a second main flow groove and a third main flow groove, each of which extends in a first direction and through which the working fluid in liquid form passes, the first main flow groove, the second main flow groove and the third main flow groove are arranged in this order in a second direction orthogonal to the first direction, a first convex array which includes a plurality of first convex portions arranged in the first direction via a first communicating groove is provided between the first main flow groove and the second main flow groove, a second convex array which includes a plurality of second convex portions arranged in the first direction via a second communicating groove is provided between the second main flow groove and the third main flow groove, the first communicating groove allows communication between the first main flow groove and the second main flow groove, the second communicating groove allows communication between the second main flow groove and the third main flow groove, and the second main flow groove includes a first intersection at which at least a part of the first communicating groove faces each second convex portion and a second intersection at which at least a part of the second communicating groove faces each first convex portion.

Also, the present invention provides a manufacturing method of a vapor chamber including a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes, the manufacturing method for vapor chamber including:

half-etching in which a surface of the first metallic sheet on a side of the second metallic sheet is half-etched to form the liquid flow path portion;

joining the first metallic sheet and the second metallic sheet such that the sealed space is formed between the first metallic sheet and the second metallic sheet; and enclosing the working fluid in the sealed space, wherein the liquid flow path portion includes a first main flow groove, a second main flow groove and a third main flow groove, each of which extends in a first direction and through which the working fluid in liquid form passes, the first main flow groove, the second main flow groove and the third main flow groove are arranged in this order in a second direction orthogonal to the first direction, a first convex array which includes a plurality of first convex portions arranged in the first direction via a first communicating groove is provided between the first main flow groove and the second main flow groove, a second convex array which includes a plurality of second convex portions arranged in the first direction via a second communicating groove is provided between the second main flow groove and the third main flow groove, the first communicating groove allows communication between the first main flow groove and the second main flow groove, the second communicating groove allows communication between the second main flow groove and the third main flow groove, and the second main flow groove includes a first intersection at which at least a part of the first communicating groove faces each second convex portion and a second intersection at which at least a part of the second communicating groove faces each first convex portion.

According to the present invention, the cross-sectional area of the flow path of the liquid flow path portion is secured and the transport function of the working fluid in liquid form is improved, which improves the thermal transport efficiency.

DESCRIPTION OF EMBODIMENTS

Figure 1:
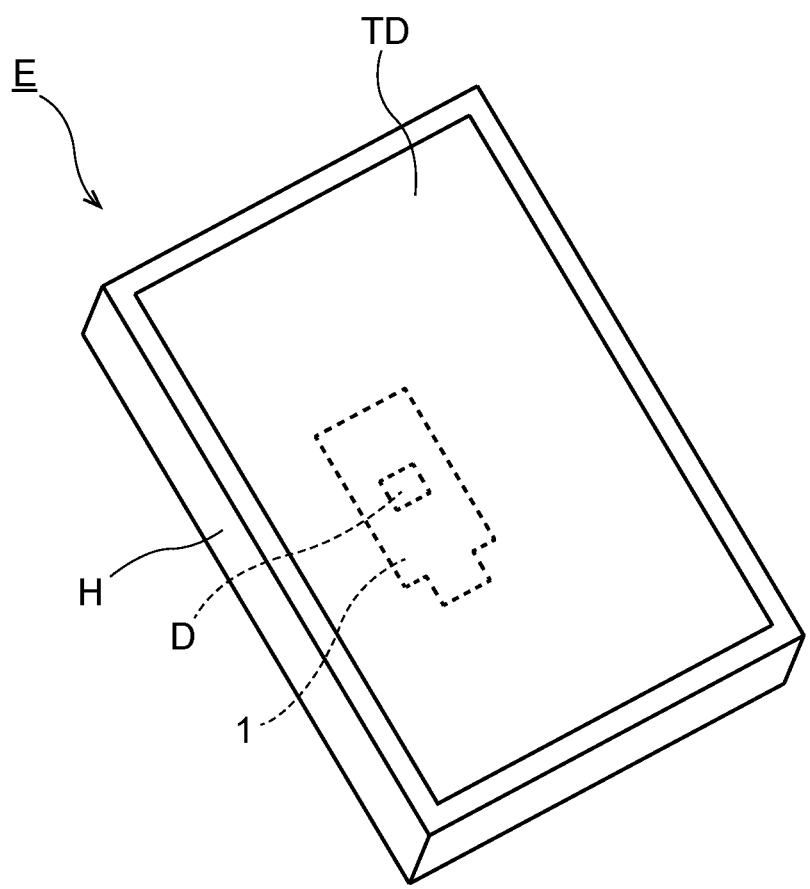
FIG. 1 is a schematic perspective view for explaining an electronic device according to a first embodiment of the present invention.

Hereinafter, embodiments according to the present invention will be explained with reference to drawings. Additionally, for convenience of illustration and easy understanding, in the drawings attached to the present specification, the scale and an aspect ratio etc. are appropriately changed and exaggerated from those of a real product.

First Embodiment

A vapor chamber, an electronic device, a metallic sheet for the vapor chamber and a manufacturing method of the vapor chamber according to a first embodiment of the present invention will be explained using FIGS. 1 to 18. A vapor chamber 1 according to this embodiment is an apparatus mounted on an electronic device E for cooling a device D as a heating element housed in the electronic device E. As an example of the device D, an electronic device accompanied with heat generation (a device to be cooled) such as a central processing unit (CPU), a light-emitting diode (LED) and a power transistor, which is used in a mobile terminal and the like such as a portable terminal or a tablet terminal, can be listed.

Here, firstly, an explanation will be made on the electronic device E on which the vapor chamber 1 is mounted according to this embodiment taking a tablet terminal as an example. As shown in FIG. 1, the electronic device E (tablet terminal) includes a housing H, the device D housed in the housing H and the vapor chamber 1. In the electronic device E shown in FIG. 1, a touch panel display TD is provided in a front surface of the housing H. The vapor chamber 1 is housed in the housing H and arranged to thermally contact to the device D. Thereby, heat generated at the device D when the electronic device E is used can be received by the vapor chamber 1. The heat received by the vapor chamber 1 is released to the outside of the vapor chamber 1 via a working fluid 2 which will be described later. In this way, the device D is effectively cooled. If the electronic device E is the tablet terminal, the device D corresponds to the central processing unit etc.

Next, the vapor chamber 1 according to this embodiment will be explained. The vapor chamber 1 includes a sealed space 3 in which the working fluid 2 is enclosed, and the working fluid 2 in the sealed space 3 repeats change of phase, so that the device D of the electronic device E described above is effectively cooled.

Figure 2:
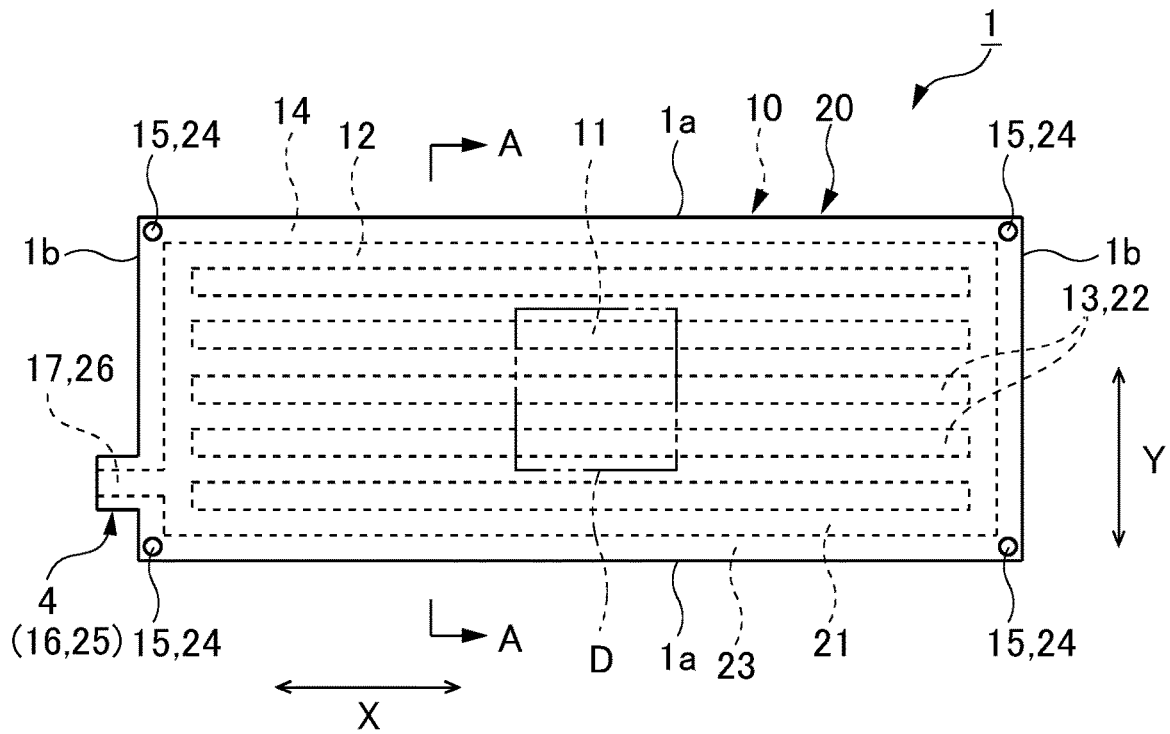
FIG. 2 is a top view showing a vapor chamber according to the first embodiment of the present invention.

The vapor chamber 1 is formed as a schematically thin plate. While the vapor chamber 1 may have any planar shape, a rectangle as shown in FIG. 2 may be applied. In this case, the vapor chamber 1 includes four linear outer edges 1a, 1b forming a planar outline. Among these, two outer edges 1a are formed along a first direction X which will be described later, and remained two outer edges 1b are formed along a second direction Y which will be described later. For example, a planar shape of the vapor chamber 1 may be a rectangle having one side of 1 cm and the other side of 3 cm, or may be a square having one side of 15 cm. The vapor chamber 1 may have any planar dimension.

Figure 3:
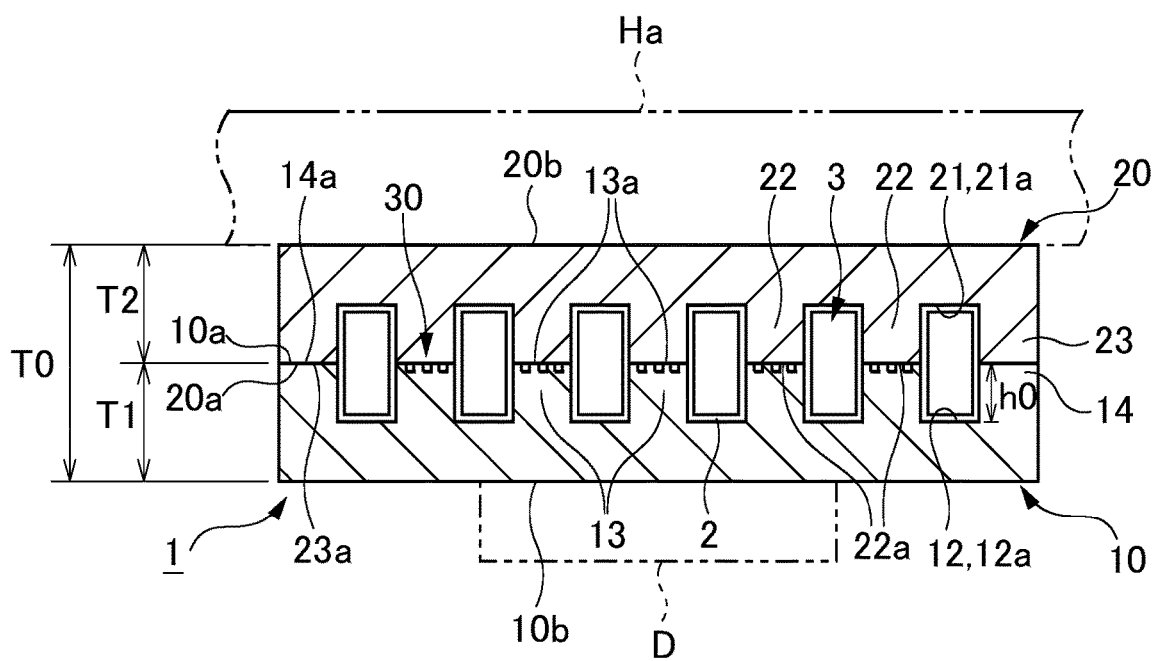
FIG. 3 is a cross-sectional view showing the vapor chamber of FIG. 2 taken along the line A-A.

As shown in FIGS. 2 and 3, the vapor chamber 1 includes a lower metallic sheet 10 (first metallic sheet) having an upper surface 10a (first surface) and a lower surface 10b (second surface) provided on an opposite side from the upper surface 10a, and an upper metallic sheet 20 (second metallic sheet) provided on the lower metallic sheet 10. The lower metallic sheet 10 and the upper metallic sheet 20 both correspond to a metallic sheet for a vapor chamber. The upper metallic sheet 20 includes a lower surface 20a (a surface on a side of the lower metallic sheet 10) layered on the upper surface 10a of the lower metallic sheet 10 (a surface on a side of the upper metallic sheet 20) and an upper surface 20b provided on an opposite side from the lower surface 20a. The device D which is an object of cooling is attached to the lower surface 10b of the lower metallic sheet 10 (especially, a lower surface of an evaporating portion 11 which will be described later.)

The thickness of the vapor chamber 1 is, for example, 0.1 mm to 1.0 mm. While FIG. 3 shows a case where a thickness T1 of the lower metallic sheet 10 and a thickness T2 of the upper metallic sheet 20 are equal, not limited to this, the thickness T1 of the lower metallic sheet 10 and the thickness T2 of the upper metallic sheet 20 may be different.

The sealed space 3 in which the working fluid 2 is enclosed is formed between the lower metallic sheet 10 and the upper metallic sheet 20. In this embodiment, the sealed space 3 includes a vapor flow path portion through which a vapor of the working fluid 2 mainly passes (a lower vapor flow path recess 12 and an upper vapor flow path recess 21 which will be described later) and a liquid flow path portion 30 through which the working fluid 2 in liquid form mainly passes. As examples of the working fluid 2, pure water, ethanol, methanol and acetone etc. can be listed.

The lower metallic sheet 10 and the upper metallic sheet 20 are joined by diffused junction which will be described later. In the embodiment shown in FIGS. 2 and 3, an example in which the lower metallic sheet 10 and the upper metallic sheet 20 are formed to be rectangular in a planar view is shown. However, this is not restrictive. Here, the planar view is a state seen in a direction which is orthogonal to a surface at which the vapor chamber 1 receives heat from the device D (the lower surface 10b of the lower metallic sheet 10) as well as a surface at which the received heat is released (the upper surface 20b of the upper metallic sheet 20), and for example, this corresponds to a state that the vapor chamber 1 is seen from an upper side (see FIG. 2) or seen from a lower side.

Additionally, when the vapor chamber 1 is installed in the mobile terminal, depending on an attitude of the mobile terminal, the vertical relationship between the lower metallic sheet 10 and the upper metallic sheet 20 may be changed. However, in this embodiment, for convenience, a metallic sheet which receives heat from the device D is called as the lower metallic sheet 10, while a metallic sheet which releases the received heat is called as the upper metallic sheet 20, and an explanation will be made in a state that the lower metallic sheet 10 is disposed at the lower side and the upper metallic sheet 20 is disposed at the upper side.

Figure 4:
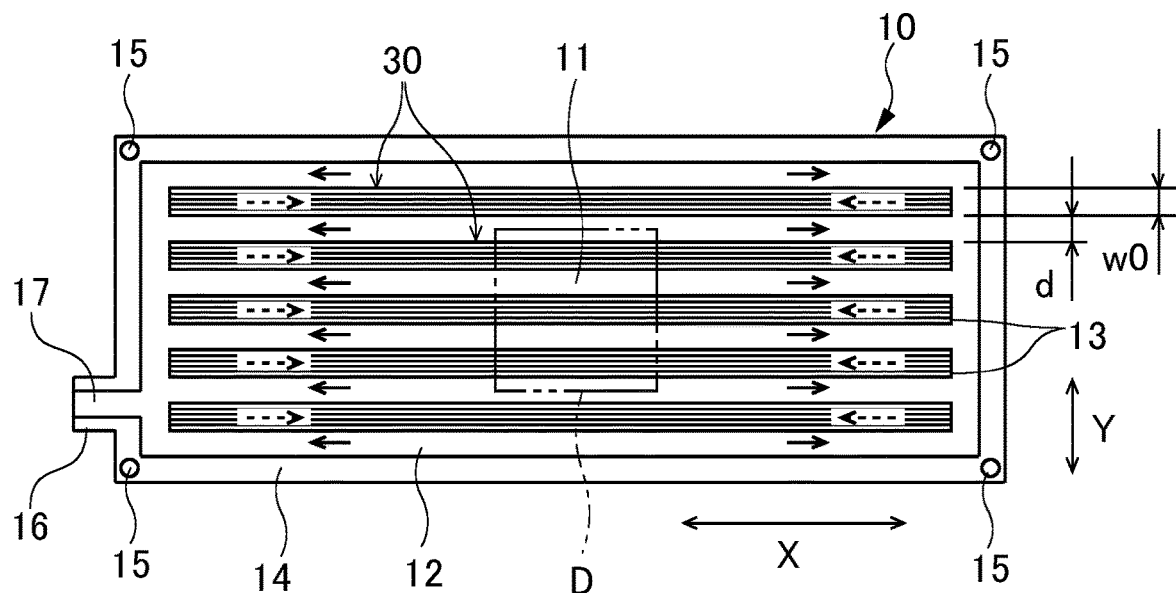
FIG. 4 is a top view of a lower metallic sheet of FIG. 2.

As shown in FIG. 4, the lower metallic sheet 10 includes the evaporating portion 11 in which the working fluid 2 evaporates to generate a vapor, and the lower vapor flow path recess 12 (a first vapor flow path recess) provided in the upper surface 10a and formed to be rectangular in a planar view. In these components, the lower vapor flow path recess 12 constitutes a part of the sealed space 3 described above, and is mainly configured such that the vapor generated in the evaporating portion 11 passes.

The evaporating portion 11 is disposed in the lower vapor flow path recess 12. The vapor in the lower vapor flow path recess 12 is diffused in a direction away from the evaporating portion 11, and most of the vapor is transported to a peripheral portion with a relatively low temperature. Additionally, the evaporating portion 11 is a portion at which the working fluid 2 in the sealed space 3 evaporates by receiving heat from the device D attached to the lower surface 10b of the lower metallic sheet 10. Consequently, the term of the evaporating portion 11 is not a concept limited to a portion overlapped with the device D, and is used as a concept including a portion which is not overlapped with the device D but allows the working fluid 2 to evaporate. Here, the evaporating portion 11 can be provided at any portion of the lower metallic sheet 10. However, in FIGS. 2 and 4, an example in which the evaporating portion 11 is provided at a center portion of the lower metallic sheet 10 is shown. In this case, an operation of the vapor chamber 1 can be stabilized regardless of the attitude of the mobile terminal in which the vapor chamber 1 is installed.

As shown in FIGS. 3 and 4, in this embodiment, a plurality of lower flow path wall portions 13 (a first flow path wall portion) protruding upward from a bottom surface 12a (which will be described later) of the lower vapor flow path recess 12 (a direction orthogonal to the bottom surface 12a) are provided in the lower vapor flow path recess 12 of the lower metallic sheet 10. In this embodiment, an example in which the lower flow path wall portions 13 extend to be elongated along the first direction X of the vapor chamber 1 (a longitudinal direction, a right and left direction in FIG. 4) is shown. Each lower flow path wall portion 13 includes an upper surface 13a (a first abutting surface, a protruding end surface) abutting a lower surface 22a of the corresponding upper flow path wall portion 22 which will be described later. The upper surface 13a is a surface which is not etched by two etching steps which will be described later, and formed on the same plane as the upper surface 10a of the lower metallic sheet 10. Also, each lower flow path wall portion 13 is separated from each other with even intervals, and disposed to be parallel with each other. In this way, such a configuration is made that the vapor of the working fluid 2 flows along a periphery of each lower flow path wall portion 13 and the vapor is transported to a peripheral portion of the lower vapor flow path recess 12, which inhibits blocking of vapor flow. Also, each lower flow path wall portion 13 is disposed to be overlapped with the corresponding upper flow path wall portion 22 (which will be described later) of the upper metallic sheet 20 in a planar view, which improves mechanical strength of the vapor chamber 1. A width w0 of each lower flow path wall portion 13 is 0.1 mm to 30 mm for example, preferably 0.1 mm to 2.0 mm, and the interval d between the lower flow path wall portions 13 adjacent to each other is 0.1 mm to 30 mm, preferably 0.1 mm to 2.0 mm. Here, the width w0 means the dimension of each lower flow path wall portion 13 in the second direction Y orthogonal to the first direction X of each lower flow path wall portion 13, and for example, corresponds to a vertical direction in FIG. 4. Also, a height h0 of each lower flow path wall portion 13 (in other words, a depth of the lower vapor flow path recess 12) (see FIG. 3) is preferably smaller than a thickness T1 of the lower metallic sheet 10 which will be described later by 10 μm or more. In this case, the difference between the thickness T1 and the height h0, that is, the thickness of the metal material of the lower metallic sheet 10 at a portion where the lower vapor flow path recess 12 is formed can be 10 μm or more. Thereby, the strength of the corresponding portion can be secured, which prevents deformation to be recessed inwardly to a pressure received from the outside air. Such height h0 may be 10 μm to 300 μm. For example, when a thickness T0 of the vapor chamber 1 is 0.5 mm and the thickness T1 of the lower metallic sheet 10 and a thickness T2 of the upper metallic sheet 20 are equal, the height h0 can be 200 μm.

As shown in FIGS. 3 and 4, a lower peripheral wall 14 is provided at a peripheral portion of the lower metallic sheet 10. The lower peripheral wall 14 is formed to surround the sealed space 3, especially the lower vapor flow path recess 12 to define the sealed space 3. Also, lower alignment holes 15 which execute positioning between the lower metallic sheet 10 and the upper metallic sheet 20 are respectively provided at four corners of the lower peripheral wall 14 in a planar view.

In this embodiment, the upper metallic sheet 20 has substantially the same configuration as in the lower metallic sheet 10 excluding the point that the liquid flow path portion 30 which will be described later is not provided. Hereinafter, the configuration of the upper metallic sheet 20 will be explained in more detail.

Figure 5:
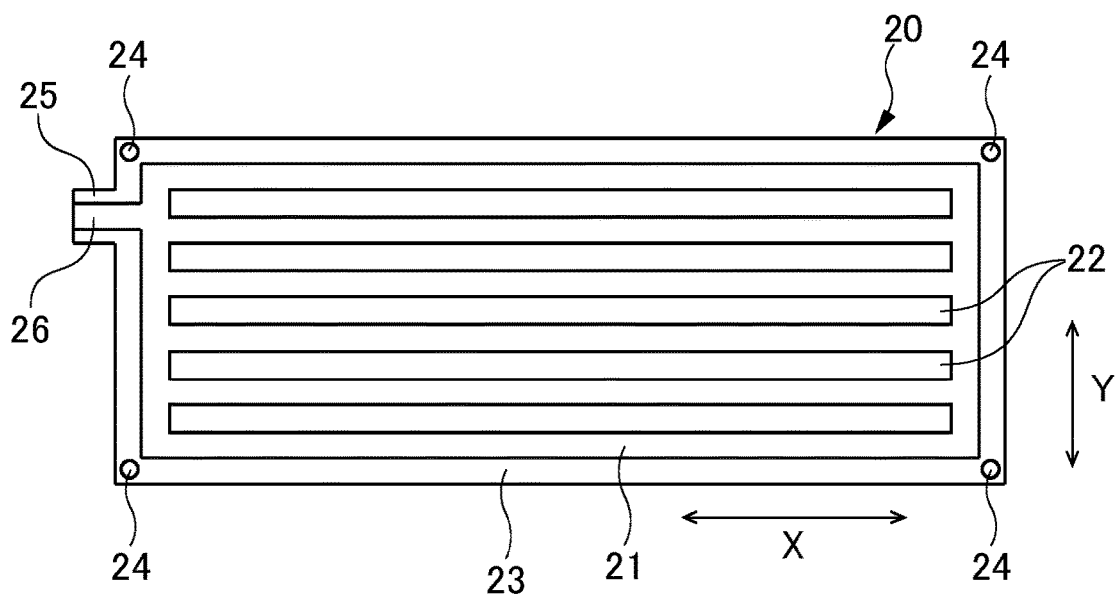
FIG. 5 is a bottom view of an upper metallic sheet of FIG. 2.

As shown in FIGS. 3 and 5, the upper metallic sheet 20 includes an upper vapor flow path recess 21 (a second vapor flow path recess) provided in the lower surface 20a. The upper vapor flow path recess 21 constitutes a part of the sealed space 3, and is mainly configured to diffuse the vapor generated in the evaporating portion 11 for cooling. More concretely, the vapor in the upper vapor flow path recess 21 is diffused in a direction away from the evaporating portion 11, and most of the vapor is transported to the peripheral portion with a relatively low temperature. Also, as shown in FIG. 3, a housing member Ha constituting a part of the housing H such as the mobile terminal (see FIG. 1) is disposed on the upper surface 20b of the upper metallic sheet 20. Thereby, the vapor in the upper vapor flow path recess 21 is cooled by the outside via the upper metallic sheet 20 and the housing member Ha.

As shown in FIGS. 2, 3 and 5, in this embodiment, a plurality of upper flow path wall portions 22 (a second flow path wall portion) protruding from the bottom surface 21a of the upper vapor flow path recess 21 to a lower side (a direction perpendicular to the bottom surface 21a) are provided in the upper vapor flow path recess 21 of the upper metallic sheet 20. In this embodiment, an example in which the upper flow path wall portions 22 extend to be elongated along the first direction X (a right and left direction of FIG. 5) of the vapor chamber 1 is shown. Each upper flow path wall portion 22 includes the planar lower surface 22a (a second abutting surface, a protruding end surface) which abuts the upper surface 10a of the lower metallic sheet 10 (more specifically, the upper surface 13a of each lower flow path wall portion 13 described above) and covers the liquid flow path portion 30. Also, each upper flow path wall portion 22 is separated from each other with even intervals and disposed to be parallel with each other. In this way, such a configuration is made that the vapor of the working fluid 2 flows along a periphery of each upper flow path wall portion 22 and the vapor is transported to a peripheral portion of the upper vapor flow path recess 21, which inhibits blocking of vapor flow. Also, each upper flow path wall portion 22 is disposed to be overlapped with the corresponding lower flow path wall portion 13 of the lower metallic sheet 10 in a planar view, which improves mechanical strength of the vapor chamber 1. Additionally, a width and a height of each upper flow path wall portion 22 are preferably the same as the width w0 and the height h0 of each lower flow path wall portion 13 described above. Here, while the bottom surface 21a of the upper vapor flow path recess 21 can be also said as a ceiling surface in the vertical disposition relationship between the lower metallic sheet 10 and the upper metallic sheet 20 as shown in FIG. 3 etc., this corresponds to a surface on a deeper side of the upper vapor flow path recess 21, so that this is described as the bottom surface 21a in the present specification.

As shown in FIGS. 3 and 5, an upper peripheral wall 23 is provided at a peripheral portion of the upper metallic sheet 20. The upper peripheral wall 23 is formed to surround the sealed space 3, especially the upper vapor flow path recess 21 to define the sealed space 3. Also, upper alignment holes 24 which execute positioning between the lower metallic sheet 10 and the upper metallic sheet 20 are respectively provided at four corners of the upper peripheral wall 23 in a planar view. In other words, such a configuration is made that each upper alignment hole 24 is disposed to be overlapped with each of the above-described lower alignment holes 15 at the time of temporary joint which will be described later, which allows positioning between the lower metallic sheet 10 and the upper metallic sheet 20.

The lower metallic sheet 10 and the upper metallic sheet 20 are permanently joined to each other preferably by the diffused junction. More specifically, as shown in FIG. 3, an upper surface 14a of the lower peripheral wall 14 of the lower metallic sheet 10 abuts a lower surface 23a of the upper peripheral wall 23 of the upper metallic sheet 20, so that the lower peripheral wall 14 and the upper peripheral wall 23 are joined to each other. Thereby, the sealed space 3 which seals the working fluid 2 is formed between the lower metallic sheet 10 and the upper metallic sheet 20. Also, the upper surface 13a of each lower flow path wall portion 13 of the lower metallic sheet 10 abut the lower surface 22a of each upper flow path wall portion 22 of the upper metallic sheet 20, so that each lower flow path wall portion 13 and the corresponding upper flow path wall portion 22 are joined to each other. This improves the mechanical strength of the vapor chamber 1. Especially, since the lower flow path wall portions 13 and the upper flow path wall portions 22 according to this embodiment are disposed with even intervals, the mechanical strength at each portion of the vapor chamber 1 can be equalized. Additionally, the lower metallic sheet 10 and the upper metallic sheet 20 may be joined by other methods such as brazing as long as permanent jointing is performed, not by the diffused junction.

Also, as shown in FIG. 2, the vapor chamber 1 further includes an injection portion 4 for pouring the working fluid 2 in the sealed space 3 at one of a pair of ends in the first direction X. The injection portion 4 includes a lower injection protruding portion 16 which protrudes from an end surface of the lower metallic sheet 10 and an upper injection protruding portion 25 which protrudes from an end surface of the upper metallic sheet 20. In these components, a lower injection flow path recess 17 is formed on an upper surface of the lower injection protruding portion 16, and the upper injection flow path recess 26 is formed on a lower surface of the upper injection protruding portion 25. The lower injection flow path recess 17 communicates with the lower vapor flow path recess 12, and the upper injection flow path recess 26 communicates with the upper vapor flow path recess 21. The lower injection flow path recess 17 and the upper injection flow path recess 26 form an injection flow path of the working fluid 2 when the lower metallic sheet 10 and the upper metallic sheet 20 are joined. The working fluid 2 passes through the injection flow path and is poured into the sealed space 3. Additionally, in this embodiment, while an example in which the injection portion 4 is provided at one of the pair of ends of the vapor chamber 1 in the first direction X, this is not restrictive.

Next, the liquid flow path portion 30 of the lower metallic sheet 10 will be explained in more detail using FIGS. 3, 4, 6 and 7.

As show in FIGS. 3 and 4, the liquid flow path portion 30 through which the working fluid 2 in liquid form passes is provided in the upper surface 10a of the lower metallic sheet 10 (more specifically, the upper surface 13a of each lower flow path wall portion 13). The liquid flow path portion 30 constitutes a part of the above-described sealed space 3, and communicates with the lower vapor flow path recess 12 and the upper vapor flow path recess 21 described above.

Figure 6:
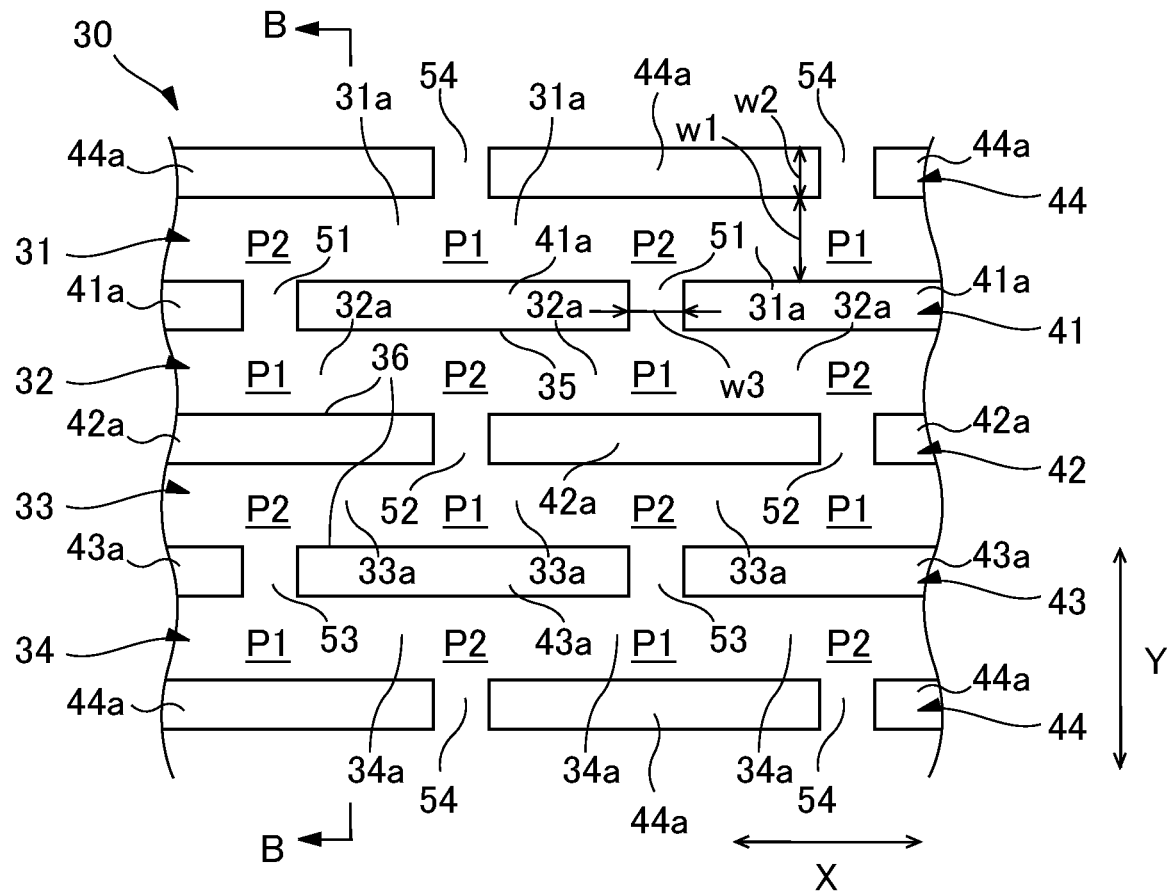
FIG. 6 is an enlarged top view showing a liquid flow path portion of FIG. 4.

As shown in FIG. 6, the liquid flow path portion 30 include a first main flow groove 31, a second main flow groove 32, a third main flow groove 33 and a fourth main flow groove 34. The first main flow groove 31 to the fourth main flow groove 34 respectively linearly extend in the first direction X to allow the working fluid 2 in liquid form to pass through, and are arranged in this order in the second direction Y described above. In other words, the fourth main flow groove 34 is arranged on an opposite side from the second main flow groove 32 with respect to the third main flow groove 33. The first main flow groove 31 to the fourth main flow groove 34 are configured to mainly transport the working fluid 2, condensed from the vapor generated at the evaporating portion 11, to the evaporating portion 11.

A first convex array 41 is provided between the first main flow groove 31 and the second main flow groove 32. The first convex array 41 includes a plurality of first convex portions 41a arranged in the first direction X. In FIG. 6, each first convex portion 41a is formed to be rectangular such that the first direction X coincides with a longitudinal direction in a planar view. A first communicating groove 51 is interposed between the first convex portions 41a adjacent to each other. The first communicating groove 51 is formed to extend in the second direction Y to allow communication between the first main flow groove 31 and the second main flow groove 32, and the working fluid 2 can reciprocate between the first main flow groove 31 and the second main flow groove 32. The first communicating groove 51 is a region between the first convex portions 41a adjacent to each other, and a region between the first main flow groove 31 and the second main flow groove 32.

A second convex array 42 is provided between the second main flow groove 32 and the third main flow groove 33. The second convex array 42 includes a plurality of second convex portions 42a arranged in the first direction X. In FIG. 6, each second convex portion 42a is formed to be rectangular such that the first direction X coincides with a longitudinal direction in a planar view. A second communicating groove 52 is interposed between the second convex portions 42a adjacent to each other. The second communicating groove 52 is formed to extend in the second direction Y to allow communication between the second main flow groove 32 and the third main flow groove 33, and the working fluid 2 can reciprocate between the second main flow groove 32 and the third main flow groove 33. The second communicating groove 52 is a region between the second convex portions 42a adjacent to each other, and a region between the second main flow groove 32 and the third main flow groove 33.

The second main flow groove 32 includes a first intersection P1 communicating with the first communicating groove 51 and a second intersection P2 communicating with the second communicating groove 52.

In these components, at the first intersection P1, at least a part of the first communicating groove 51 faces the second convex portion 42a. As shown in FIG. 6, at the first intersection P1, the entire first communicating groove 51 (an entire region of the first communicating groove 51 in a width direction (the first direction X)) faces the second convex portion 42a. Thereby, over the entire first intersection P1, in a pair of side walls 35, 36 along the first direction X of the second main flow groove 32, the side wall 36 on an opposite side from the first communicating groove 51 (a wall of each second convex portion 42a) is disposed. In a form shown in FIG. 6, seen from the second direction Y, the first communicating groove 51 is disposed to be overlapped with the center of each second convex portion 42a in the first direction X. In this way, at the first intersection P1, the second main flow groove 32 and the first communicating groove 51 intersect to form a T shape. The first intersection P1 is a region formed by main flow groove body portions 31a to 34a adjacent to each other in the first direction X, and a region formed by the communicating grooves 51 to 54 and the convex portions 41a to 44a adjacent to each other in the second direction Y. In other words, this is a region in which the main flow grooves 31 to 34 and the communicating grooves 51 to 54 intersect (that is, an overlapping region). Here, the main flow groove body portions 31a to 34a constitute a part of the first main flow groove 31 to the fourth main flow groove 34, and are portions provided between the first intersection P1 and the second intersection P2, and portions positioned between the convex portions 41a to 44a adjacent to each other.

In the same manner, at the second intersection P2, at least a part of the second communicating groove 52 faces the first convex portion 41a. As shown in FIG. 6, at the second intersection P2, the entire second communicating groove 52 (an entire region of the second communicating groove 52 in the width direction (the first direction X)) faces each first convex portion 41a. Thereby, over the entire second intersection P2, in a pair of side walls 35, 36 along the first direction X of the second main flow groove 32, the side wall 35 on an opposite side from the second communicating groove 52 (a wall of each first convex portion 41a) is disposed. In the form shown in FIG. 6, seen from the second direction Y, the second communicating groove 52 is disposed to be overlapped with the center of the first convex portion 41a in the first direction X. In this way, at the second intersection P2, the second main flow groove 32 and the second communicating groove 52 intersect to form a T shape. The second intersection P2 is a region formed by the main flow groove body portions 31a to 34a adjacent to each other in the first direction X, and a region formed by the communicating grooves 51 to 54 and the convex portions 41a to 44a adjacent to each other in the second direction Y. In other words, this is a region in which the main flow grooves 31 to 34 and the communicating grooves 51 to 54 intersect (that is, an overlapping region).

As described above, at the first intersection P1 of the second main flow groove 32, the first communicating groove 51 faces each second convex portion 42a, and at the second intersection P2 of the second main flow groove 32, the second communicating groove 52 faces each first convex portion 41a. As a result, the first communicating groove 51 and the second communicating groove 52 are not disposed in a straight line. In other words, the first communicating groove 51 communicating with the second main flow groove 32 on one side and the second communicating groove 52 communicating with the second main flow groove 32 on the other side are not disposed in the straight line.

In this embodiment, each first convex portion 41a and each second convex portion 42a have the same shape, and an arrangement pitch of the first convex portions 41a is the same as that of the second convex portions 42a. Moreover, the first convex portions 41a and the second convex portions 42a are arranged to be shifted to each other in the first direction X by a dimension which is a half of this arrangement pitch.

Figure 14:
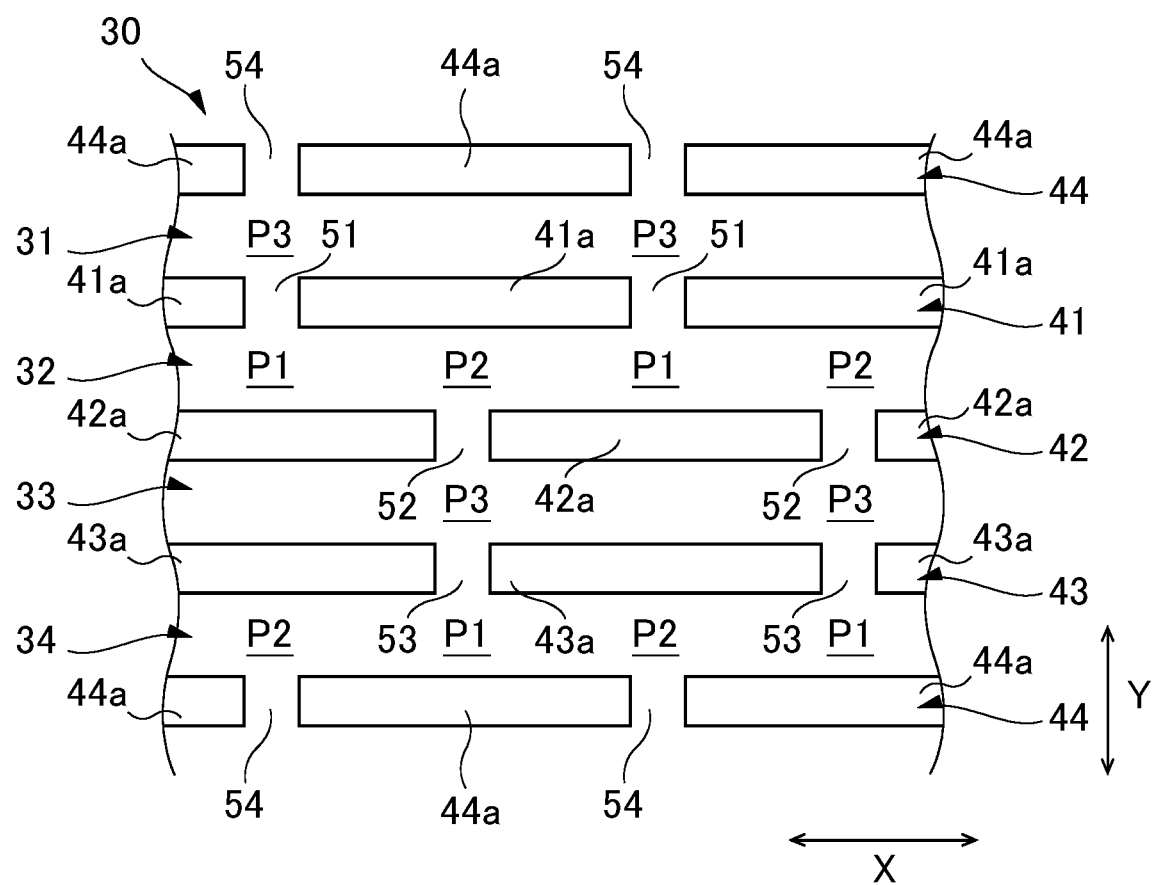
FIG. 14 is a drawing showing a modification of FIG. 6.

Also, in this embodiment, the first intersection P1 and the second intersection P2 of the second main flow groove 32 are adjacent to each other. In other words, no other intersection (for example, a third intersection P3 as shown in FIG. 14 which will be described later) is interposed between the first intersection P1 and the second intersection P2. Moreover, the second main flow groove 32 includes a plurality of first intersections P1 and a plurality of second intersections P2, and each first intersection P1 and each second intersection P2 are alternately arranged in the first direction X. In other words, the pair of side walls 35, 36 of the second main flow groove 32 is intermittently formed, and dividing positions of each of the side walls 35, 36 are shifted to each other in the first direction X.

Incidentally, a third convex array 43 is provided between the third main flow groove 33 and the fourth main flow groove 34. In the same manner as the first convex array 41, the third convex array 43 includes a plurality of third convex portions 43a arranged in the first direction X. A third communicating groove 53 is interposed between the third convex portions 43a adjacent to each other. The third communicating groove 53 is formed to extend in the second direction Y to allow communication between the third main flow groove 33 and the fourth main flow groove 34, and the working fluid 2 can reciprocate between the third main flow groove 33 and the fourth main flow groove 34. The third communicating groove 53 is a region formed by the third convex portions 43a adjacent to each other, and a region formed by the third main flow groove 33 and the fourth main flow groove 34.

The third main flow groove 33 includes the first intersection P1 communicating with the second communicating groove 52 and the second intersection P2 communicating with the third communicating groove 53. In these components, at the first intersection P1, at least a part of the second communicating groove 52 faces each third convex portion 43a. As shown in FIG. 6, at the first intersection P1, the entire second communicating groove 52 (an entire region of the second communicating groove 52 in the width direction (the first direction X)) faces each third convex portion 43a.

Thereby, over the entire first intersection P1, in a pair of side walls 35, 36 along the first direction X of the third main flow groove 33, the side wall 36 on an opposite side from the second communicating groove 52 (a wall of each third convex portion 43a) exists. In the form shown in FIG. 6, seen from the second direction Y, the second communicating groove 52 is disposed to be overlapped with the center of each third convex portion 43a in the first direction X. In this way, at the first intersection P1, the third main flow groove 33 and the second communicating groove 52 intersect to form a T shape.

In the same manner, at the second intersection P2, at least a part of the third communicating groove 53 faces each second convex portion 42a. In FIG. 6, at the second intersection P2, the entire of the third communicating groove 53 (an entire region of the third communicating groove 53 in the width direction (the first direction X)) faces each second convex portion 42a. Thereby, over the entire second intersection P2, in the pair of side walls 35, 36 along the first direction X of the third main flow groove 33, the side wall 35 on an opposite side from the third communicating groove 53 (a wall of each second convex portion 42a) is disposed. In the form shown in FIG. 6, seen from the second direction Y, the third communicating groove 53 is disposed to be overlapped with the center of each second convex portion 42a in the first direction X. In this way, at the second intersection P2, the third main flow groove 33 and the third communicating groove 53 intersect to form a T shape.

In other words, in this embodiment, each first convex portion 41a, each second convex portions 42a and each third convex portion 43a have the same shape, and the first convex portions 41a, the second convex portions 42a and the third convex portions 43a have the same arrangement pitch. Moreover, each second convex portion 42a and each third convex portion 43a are arranged to be shifted to each other in the first direction X by a dimension which is a half of this arrangement pitch. As a result, each first convex portion 41a and each third convex portion 43a are arranged at the same position in the first direction X, and seen in the second direction Y, each first convex portion 41a and each third convex portion 43a are overlapped.

In this embodiment, in the same manner as the second main flow groove 32, the first intersection P1 and the second intersection P2 of the third main flow groove 33 are adjacent to each other. Moreover, the third main flow groove 33 includes the plurality of first intersections P1 and the plurality of second intersections P2, and each first intersection P1 and each second intersection P2 are alternately arranged in the first direction X. In other words, the pair of side walls 35, 36 of the third main flow groove 33 is intermittently formed, and dividing positions of each of the side walls 35, 36 are shifted to each other in the first direction X.

Since the first convex portions 41a, the second convex portions 42a and the third convex portions 43a are disposed as described above, in this embodiment, the first convex portions 41a, the second convex portions 42a and the third convex portions 43a have a staggered arrangement. As a result, the first communicating groove 51, the second communicating groove 52 and the third communicating groove 53 have the staggered arrangement.

FIG. 6 shows one set of main flow grooves when the above-described first main flow groove 31 to the fourth main flow groove 34 are defined as one set. This set may be plural, so that multiple main flow grooves 31 to 34 may be formed on the upper surface 13a of each lower flow path wall portion 13 as a whole. Additionally, in the main flow grooves constituting the liquid flow path portion 30, the first main flow groove 31 to the fourth main flow groove 34 do not necessarily constitute one set, and any number of main flow grooves may be applied, not limited to a multiple of four, as long as at least three main flow grooves are formed.

In this case, on a side of the fourth main flow groove 34 opposite from the third main flow groove 33, the above-described first main flow groove 31 is provided, and a fourth convex array 44 is provided between the fourth main flow groove 34 and the first main flow groove 31. In the same manner as the second convex array 42, the fourth convex array 44 includes a plurality of fourth convex portions 44a arranged in the first direction X. The fourth convex portions 44a and the second convex portions 42a are arranged at the same positions in the first direction X, and seen in the second direction Y, each fourth convex portion 44a and each second convex portion 42a are overlapped. A fourth communicating groove 54 is interposed between the third convex portions 43a adjacent to each other. The fourth communicating groove 54 is formed to extend in the second direction Y to allow communication between the fourth main flow groove 34 and the first main flow groove 31, and the working fluid 2 can reciprocate between the fourth main flow groove 34 and the first main flow groove 31. The fourth communicating groove 54 is a region between the fourth convex portions 44a adjacent to each other, and a region between the fourth main flow groove 34 and the first main flow groove 31.

The fourth main flow groove 34 includes the first intersection P1 and the second intersection P2 in the same manner as the second main flow groove 32. Here, at the first intersection P1, the fourth main flow groove 34 communicates with the third communicating groove 53, and at the second intersection P2, the fourth main flow groove 34 communicates with the fourth communicating groove 54. Also, the first main flow groove 31 includes the first intersection P1 and the second intersection P2 in the same manner as the third main flow groove 33. Here, at the first intersection P1, the first main flow groove 31 communicates with the fourth communicating groove 54, and at the second intersection P2, the first main flow groove 31 communicates with the first communicating groove 51. Since the first intersection P1 and the second intersection P2 in the first main flow groove 31 and the fourth main flow groove 34 are similar to the first intersection P1 and the second intersection P2 in the second main flow groove 32 and the third main flow groove 33, a detailed explanation thereof is omitted here.

Each of the convex portions 41a to 44a may be rectangular and have the staggered arrangement as described above over the entire liquid flow path portion 30.

Incidentally, a width w1 of the first main flow groove 31 to the fourth main flow groove 34 (a dimension in the second direction Y) is preferably larger than a width w2 of each first convex portion 41a to each fourth convex portion 44a (a dimension in the second direction Y.) In such a case, the ratio of the first to fourth main flow grooves 31 to 34 to the upper surface 13a of each lower flow path wall portion 13 can be made larger. Consequently, a flow path density of the main flow grooves 31 to 34 on the upper surface 13a can be increased to improve a transport function of the working fluid 2 in liquid form. For example, the width w1 of the first main flow groove 31 to the fourth main flow groove 34 may be 30 μm to 200 μm, and the width w2 of each first convex portion 41a to each fourth convex portion 44a may be 20 μm to 180 μm.

A depth h1 of the first main flow groove 31 to the fourth main flow groove 34 is preferably smaller than a depth h0 of the above-described lower vapor flow path recess 12. In such a case, capillary action of the first main flow groove 31 to the fourth main flow groove 34 can be improved. For example, the depth h1 of the first main flow groove 31 to the fourth main flow groove 34 is preferably about a half of the depth h0, and may be 5 μm to 180 μm.

Also, a width w3 of the first communicating groove 51 to the fourth communicating groove 54 (a dimension in the first direction X) is preferably smaller than the width w1 of the first main flow groove 31 to the fourth main flow groove 34. In such a case, during a period that the working fluid 2 in liquid form is transported toward the evaporating portion 11 in each of the main flow grooves 31 to 34, the working fluid 2 is inhibited from flowing to the communicating grooves 51 to 54, which improves the transport function of the working fluid 2. On the other hand, when dryout occurs at any of the main flow grooves 31 to 34, the working fluid 2 can be moved from the main flow grooves 31 to 34 adjacent thereto via the corresponding communicating grooves 51 to 54, and accordingly, the dryout is immediately eliminated to secure the transport function of the working fluid 2. In other words, as long as passage through the main flow grooves 31 to 34 adjacent to each other is allowed, the first communicating groove 51 to the fourth communicating groove 54 can exert a function even if they have a smaller width than the width w1 of the main flow grooves 31 to 34. The width w3 of such first communicating groove 51 to fourth communicating groove 54 may be 20 μm to 180 μm, for example.

The depth h3 of the first communicating groove 51 to the fourth communicating groove 54 may be shallower than the depth h1 of the first main flow groove 31 to the fourth main flow groove 34 in accordance with the width w3 thereof. For example, the depth h3 of the first communicating groove 51 to the fourth communicating groove 54 (not shown) may be 40 μm assuming that the depth h1 of the first main flow groove 31 to the fourth main flow groove 34 is 50 μm.

Here, a method of confirming the width and the depth of the main flow grooves 31 to 34 and the width and the depth of the communicating grooves 51 to 54 from the vapor chamber 1 in a finished form will be described later.

Figure 7:
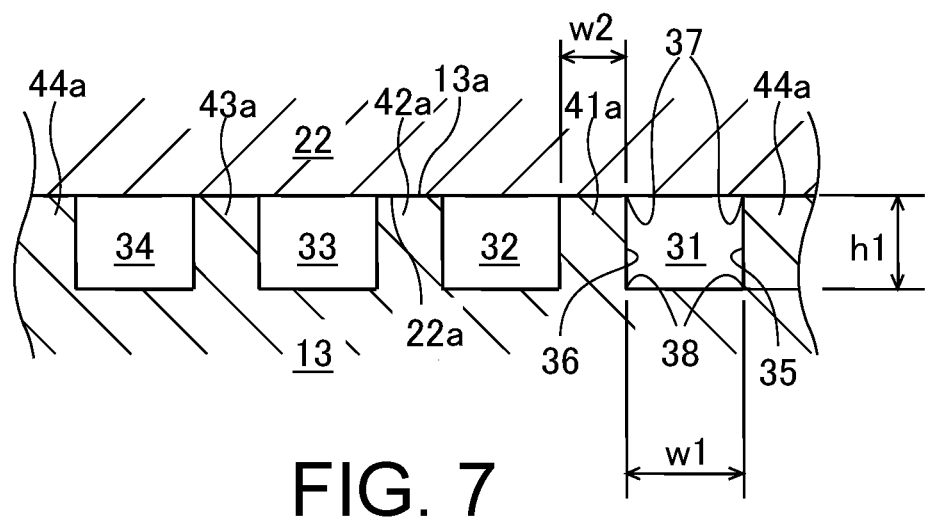
FIG. 7 is a cross-sectional view of FIG. 6 taken along the line B-B with addition of an upper flow path wall portion of the upper metallic sheet.

The shape of a cross section (a cross section in the second direction Y) of the first main flow groove 31 to the fourth main flow groove 34 is not particularly limited, and for example, may be rectangular, curved, semi-circular or V-shaped. The same is applied to the shape of a cross section (a cross section in the first direction X) of the first communicating groove 51 to the fourth communicating groove 54. In FIG. 7, an example in which the cross section of the first main flow grooves 31 to the fourth main flow groove 34 is formed to be rectangular is shown.

Incidentally, the above-described liquid flow path portion 30 is formed on the upper surface 13a of each lower flow path wall portion 13 of the lower metallic sheet 10. On the other hand, in this embodiment, the lower surface 22a of each upper flow path wall portion 22 of the upper metallic sheet 20 is formed to be planar. Thereby, each of the main flow grooves 31 to 34 of the liquid flow path portion 30 is covered by the lower surface 22a which is planar. In this case, as shown in FIG. 7, by the pair of side walls 35, 36 extending in the first direction X of the main flow grooves 31 to 34 and the lower surface 22a of each upper flow path wall portion 22, two corner portions 37 in a right angle or an acute angle can be formed, which improves capillary action at the two corner portions 37. In other words, while two corner portions 38 can be formed also by a bottom surface of the main flow grooves 31 to 34 (a surface on the side of the lower surface 10b of the lower metallic sheet 10) and the pair of side walls 35, 36 of the main flow grooves 31 to 34, when the main flow grooves 31 to 34 are formed by etching as will be described later, the corner portions 38 on the side of the bottom surface tend to be formed to be rounded. Consequently, capillary action can be improved at the corner portions 37 on a side of the lower surface 22a of each upper flow path wall portion 22 by forming the lower surface 22a of each upper flow path wall portion 22 to be planar to cover the main flow grooves 31 to 34 and the communicating grooves 51 to 54. Additionally, in FIG. 7, for clarity of the figure, the side walls 35, 36 and the corner portions 37, 38 are shown only with respect to the first main flow groove 31, and the side walls 35, 36 and the corner portions 37, 38 are omitted with respect to the second main flow groove 32 to the fourth main flow groove 34.

Additionally, while a material used for the lower metallic sheet 10 and the upper metallic sheet 20 is not especially limited as long as the material has a good thermal conductivity, for example, the lower metallic sheet 10 and the upper metallic sheet 20 are preferably formed by copper (an oxygen-free copper) or copper alloy. This improves thermal conductivity of the lower metallic sheet 10 and the upper metallic sheet 20. As a result, heat release efficiency of the vapor chamber 1 can be improved. Alternatively, as long as a desired heat release efficiency can be obtained, other metallic materials such as aluminum or other metallic alloy materials such as stainless steel may be used for these metallic sheets 10 and 20.

Next, an operation of this embodiment constituted by such configuration will be explained. Here, firstly, a manufacturing method of the vapor chamber 1 will be explained using FIGS. 8 to 13, but an explanation of a half etching step of the upper metallic sheet 20 is simplified. Additionally, in FIGS. 8 to 13, the same cross section as in FIG. 3 is shown.

Figure 8:
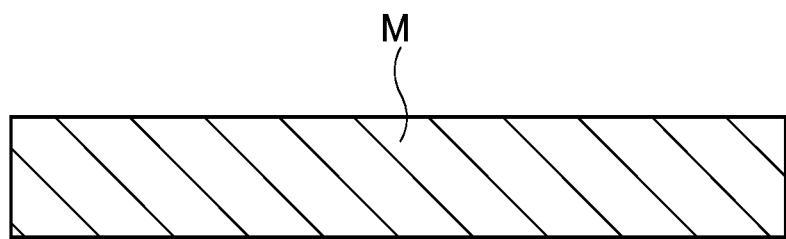
FIG. 8 is a drawing for explaining a preparation step of the lower metallic sheet in a manufacturing method of the vapor chamber according to the first embodiment of the present invention.

Firstly as shown in FIG. 8, as a preparation step, a planar metal material sheet M is prepared.

Figure 9:
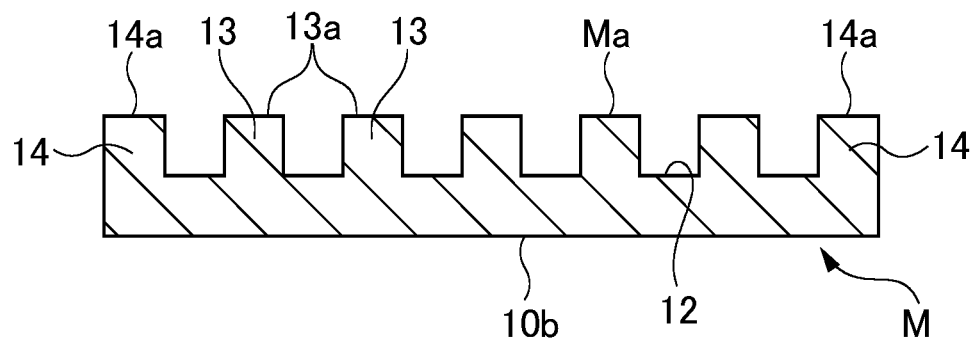
FIG. 9 is a drawing for explaining a first half-etching step of the lower metallic sheet in the manufacturing method of the vapor chamber according to the first embodiment of the present invention.

After that, as show in FIG. 9, the metal material sheet M is half-etched to form the lower vapor flow path recess 12 constituting a part of the sealed space 3. In this case, firstly, a not shown first resist film is formed to have a pattern corresponding to the plurality of lower flow path wall portions 13 and the lower peripheral wall 14 by a photolithographic technique on an upper surface Ma of the metal material sheet M. Thereafter, as a first half etching step, the upper surface Ma of the metal material sheet M is half-etched. Thereby, a portion of the upper surface Ma of the metal material sheet M corresponding to a resist opening (not shown) of the first resist film is half-etched, and the lower vapor flow path recess 12, the lower flow path wall portions 13 and the lower peripheral wall 14 as shown in FIG. 9 are formed. At this time, the lower injection flow path recess 17 as shown in FIGS. 2 and 4 is simultaneously formed, and the metal material sheet M is etched to have an outer shape as shown in FIG. 4 from the upper surface Ma and a lower surface, thereby a predetermined outer shape can be obtained. After the first half etching step, the first resist film is removed. Additionally, the half etching means etching to form a recess not penetrating through a material. Consequently, the depth of the recess formed by the half etching is not limited to a half of the thickness of the lower metallic sheet 10. As etching liquid, for example, ferric chloride etching liquid such as aqueous ferric chloride, or copper chloride etching liquid such as aqueous copper chloride can be used.

Figure 10:
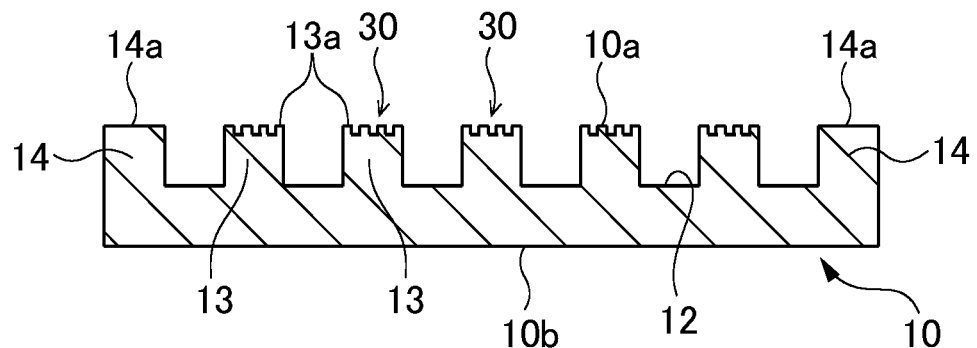
FIG. 10 is a drawing for explaining a second half-etching step of the lower metallic sheet in the manufacturing method of the vapor chamber according to the first embodiment of the present invention.

After the lower vapor flow path recess 12 is formed, as shown in FIG. 10, the liquid flow path portion 30 is formed on the upper surface 13a of each lower flow path wall portion 13.

In this case, firstly, a not shown second resist film is formed to have a pattern corresponding to the first convex portions 41*a* to the fourth convex portions 44*a* of the liquid flow path portion 30 by the photolithographic technique on the upper surface 13*a* of each lower flow path wall portion 13. After that, as a second half etching step, the upper surface 13*a* of each lower flow path wall portion 13 is half-etched. Thereby, a portion of the upper surface 13*a* corresponding to a resist opening (not shown) of the second resist film is half-etched, and the liquid flow path portion 30 is formed on the upper surface 13*a* of each lower flow path wall portion 13. In other words, on the upper surface 13*a*, each of the convex portions 41*a* to 44*a* is formed. By these convex portions 41*a* to 44*a*, the first main flow groove 31 to the fourth main flow groove 34 and the first communicating groove 51 to the fourth communicating groove 54 are defined. After the second half etching step, the second resist film is removed.

In this way, the lower metallic sheet 10 formed with the liquid flow path portion 30 is obtained. Additionally, by forming the liquid flow path portion 30 as the second half etching step as a different step from the first half etching step, the main flow grooves 31 to 34 and the communicating grooves 51 to 54 can be easily formed with a depth which is different from the depth h0 of the lower vapor flow path recess 12. However, the lower vapor flow path recess 12 and the main flow grooves 31 to 34 as well as the communicating grooves 51 to 54 may be formed with the same half etching step. In such a case, the number of half etching step can be reduced, which can reduce a manufacturing cost of the vapor chamber 1.

On the other hand, in the same manner as the lower metallic sheet 10, the upper metallic sheet 20 is half-etched from the lower surface 20*a* to form the upper vapor flow path recess 21, the upper flow path wall portions 22 and the upper peripheral wall 23. In this way, the above-described upper metallic sheet 20 is obtained.

Figure 11:
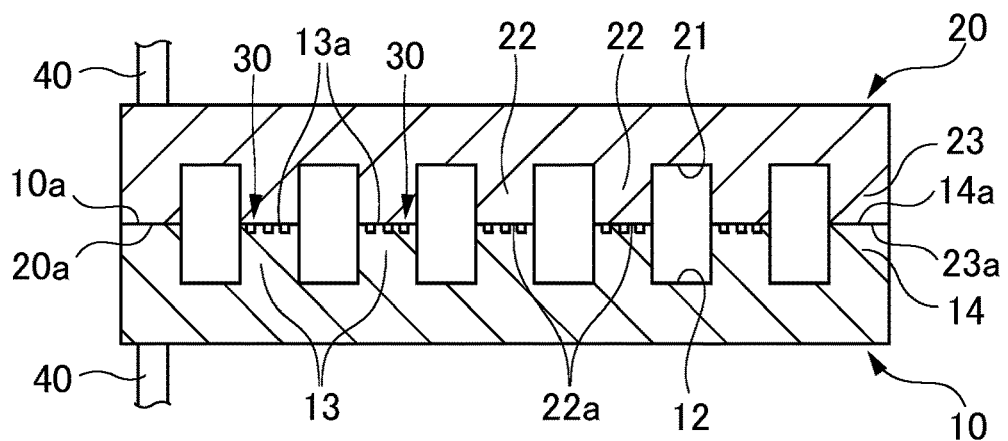
FIG. 11 is a drawing for explaining a temporary joint step in the manufacturing method of the vapor chamber according to the first embodiment of the present invention.

Next, as shown in FIG. 11, as a temporary joint step, the lower metallic sheet 10 having the lower vapor flow path recess 12 and the upper metallic sheet 20 having the upper vapor flow path recess 21 are temporarily joined. In such a case, firstly, using the lower alignment holes 15 of the lower metallic sheet 10 (see FIGS. 2 and 4) and the upper alignment holes 24 of the upper metallic sheet 20 (see FIGS. 2 and 5), positioning of the lower metallic sheet 10 and the upper metallic sheet 20 is executed. Thereafter, the lower metallic sheet 10 and the upper metallic sheet 20 are fixed. While a fixing method is not particularly limited, for example, the lower metallic sheet 10 and the upper metallic sheet 20 are fixed by executing resistance welding to the lower metallic sheet 10 and the upper metallic sheet 20. In this case, as shown in FIG. 11, a resistance spot welding is preferably executed using an electrode rod 40. Instead of resistance welding, laser welding may be executed. Alternatively, ultrasonic junction may be executed to fix the lower metallic sheet 10 and the upper metallic sheet 20 by irradiating ultrasonic waves. Further, an adhesive agent may be used, and the adhesive agent including no or little organic constituent is preferably used. In this way, the lower metallic sheet 10 and the upper metallic sheet 20 are fixed with execution of the positioning.

Figure 12:
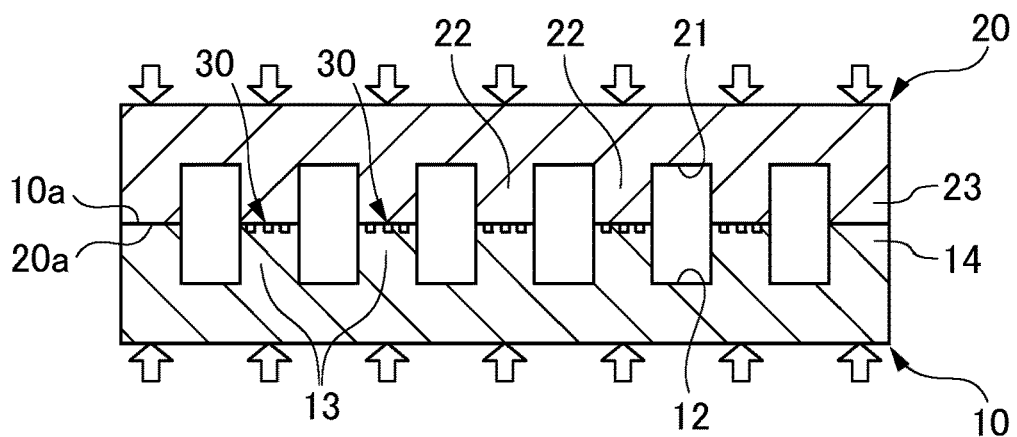
FIG. 12 is a drawing for explaining a permanent joint step in the manufacturing method of the vapor chamber according to the first embodiment of the present invention.

After the temporary joint, as shown in FIG. 12, as a permanent joint step, the lower metallic sheet 10 and the upper metallic sheet 20 are permanently joined by the diffused junction. The diffused junction is a method in which the lower metallic sheet 10 and the upper metallic sheet 20 to be joined are closely contacted, and each of the metallic sheets 10, 20 is pressurized to be heated in a contact direction in a controlled atmosphere such as vacuum or inert gas to execute joint using diffusion of atoms generated at joint surfaces. While the material of the lower metallic sheet 10 and the upper metallic sheet 20 are heated to a temperature approximate to a melting point in the diffused junction, this temperature is lower than the melting point, which avoids melting and deformation of each of the metallic sheets 10, 20. More specifically, the upper surface 14*a* of the lower peripheral wall 14 of the lower metallic sheet 10 and the lower surface 23*a* of the upper peripheral wall 23 of the upper metallic sheet 20 are subjected to the diffused junction as joint surfaces. Thereby, by the lower peripheral wall 14 and the upper peripheral wall 23, the sealed space 3 is formed between the lower metallic sheet 10 and the upper metallic sheet 20. Also, by the lower injection flow path recess 17 (see FIGS. 2 and 4) and the upper injection flow path recess 26 (see FIGS. 2 and 5), an injection flow path of the working fluid 2 communicating with the sealed space 3 is formed. Further, the upper surface 13*a* of each lower flow path wall portion 13 of the lower metallic sheet 10 and the lower surface 22*a* of each upper flow path wall portion 22 of the upper metallic sheet 20 are subjected to the diffused junction as joint surfaces, so that mechanical strength of the vapor chamber 1 is improved. The liquid flow path portion 30 formed on the upper surface 13*a* of each lower flow path wall portion 13 remains as a flow path of the working fluid 2 in liquid form.

Figure 13:
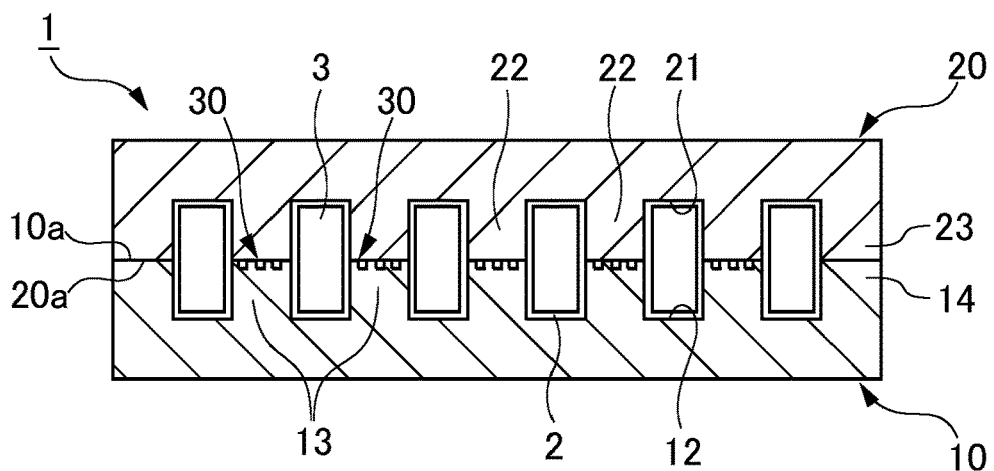
FIG. 13 is a drawing for explaining a enclosing step of a working fluid in the manufacturing method of the vapor chamber according to the first embodiment of the present invention.

After the permanent joint, as shown in FIG. 13, as an enclosing step, the working fluid 2 is poured into the sealed space 3 from the injection portion 4 (see FIG. 2). At this time, firstly, the sealed space 3 is depressurized by vacuuming, and then the working fluid 2 is poured into the sealed space 3. At the time of injection, the working fluid 2 passes through the injection flow path formed by the lower injection flow path recess 17 and the upper injection flow path recess 26. For example, while the enclosing amount of the working fluid 2 depends on the configuration of the liquid flow path portion 30 in the vapor chamber 1, it may be 10% to 30% to the entire volume of the sealed space 3.

After the injection of the working fluid 2, the above-described injection flow path is sealed. For example, a laser may be irradiated to the injection portion 4 to seal the injection flow path by partially melting the injection portion 4. Thereby, communication between the sealed space 3 and the outside is blocked, and the working fluid 2 is enclosed in the sealed space 3. This prevents leaking of the working fluid 2 in the sealed space 3 to the outside. Additionally, for sealing, swaging or brazing of the injection portion 4 may be executed.

As described above, the vapor chamber 1 according to this embodiment can be obtained.

Next, an operation method of the vapor chamber 1, that is, a cooling method of the device D will be explained.

The vapor chamber 1 thus obtained is installed in the housing H of the mobile terminal etc., and the device D such as the CPU which is an object of cooling is attached to the lower surface 10*b* of the lower metallic sheet 10. Since the amount of the working fluid 2 poured into the sealed space 3 is small, the working fluid 2 in liquid form in the sealed space 3 attaches to a wall surface of the sealed space 3, that is, a wall surface of the lower vapor flow path recess 12, a wall surface of the upper vapor flow path recess 21 and a wall surface of the liquid flow path portion 30 by surface tension thereof.

When the device D generates heat in this state, the working fluid 2 existing at the evaporating portion 11 in the lower vapor flow path recess 12 receives the heat from the device D. The received heat is absorbed as latent heat and the working fluid 2 evaporates (vaporization) to generate the vapor of the working fluid 2. Most of the generated vapor diffuses in the lower vapor flow path recess 12 and the upper vapor flow path recess 21 constituting the sealed space 3 (see solid arrows of FIG. 4). The vapor in the upper vapor flow path recess 21 and the lower vapor flow path recess 12 is separated from the evaporating portion 11, and most of the vapor is transported to a peripheral portion of the vapor chamber 1 with a relatively low temperature. The diffused vapor is subjected to heat dissipation to the lower metallic sheet 10 and the upper metallic sheet 20 to be cooled. The heat received by the lower metallic sheet 10 and the upper metallic sheet 20 from the vapor is transferred to the outside via the housing member Ha (see FIG. 3).

Since the vapor is subjected to heat dissipation to the lower metallic sheet 10 and the upper metallic sheet 20, the vapor loses the latent heat absorbed in the evaporating portion 11 and is condensed. The working fluid 2 in a liquid form by condensation is attached to the wall surfaces of the lower vapor flow path recess 12 or the wall surfaces of the upper vapor flow path recess 21. Here, since the working fluid 2 continues to be evaporated at the evaporating portion 11, the working fluid 2 at portions other than the evaporating portion 11 in the liquid flow path portion 30 is transported toward the evaporating portion 11 (see dashed arrows in FIG. 4). As a result, the working fluid 2 in liquid form attached to the wall surfaces of the lower vapor flow path recess 12 and the wall surfaces of the upper vapor flow path recess 21 moves toward the liquid flow path portion 30 and is inserted into the liquid flow path portion 30. In other words, the working fluid 2 is inserted into the first main flow groove 31 to the fourth main flow groove 34 via the first communicating groove 51 to the fourth communicating groove 54, so that the first main flow groove 31 to the fourth main flow groove 34 and the first communicating groove 51 to the fourth communicating groove 54 are filled with the working fluid 2 in liquid form. Consequently, due to capillary action of each of the main flow grooves 31 to 34, the working fluid 2 which is filled obtains thrust toward the evaporating portion 11, and is smoothly transported to the evaporating portion 11.

At the liquid flow path portion 30, in the main flow grooves 31 to 34, one communicates with another which is adjacent thereto via the corresponding communicating grooves 51 to 54. Thereby, the working fluid 2 in liquid form reciprocates between the main flow grooves 31 to 34 adjacent to each other, which inhibits occurrence of dryout in the main flow grooves 31 to 34. Accordingly, capillary action is applied to the working fluid 2 in each of the main flow grooves 31 to 34, so that the working fluid 2 is smoothly transported toward the evaporating portion 11.

Also, since each of the main flow grooves 31 to 34 includes the above-described first intersection P1 and the second intersection P2, loss of capillary action acting on the working fluid 2 in each of the main flow grooves 31 to 34 is prevented. Here, in a case where the first communicating groove 51 and the second communicating groove 52 are arranged in the straight line via the second main flow groove 32 for example, both of the pair of side walls 35, 36 do not exist at an intersection with the second main flow groove 32. In such a case, capillary action in a direction toward the evaporating portion 11 is lost at the intersection, which can reduce the thrust of the working fluid 2 toward the evaporating portion 11.

On the other hand, in this embodiment, as described above, the first communicating groove 51 communicating with the second main flow groove 32 on one side and the second communicating groove 52 communicating therewith on the other side are not arranged on the straight line. In such a case, as shown FIG. 6, at the first intersection P1, in the pair of side walls 35, 36 along the first direction X of the second main flow groove 32, the side wall 36 on an opposite side from the first communicating groove 51 is disposed. Thereby, at the first intersection P1, loss of capillary action in the direction toward the evaporating portion 11 is prevented. In the same matter, also at the second intersection P2, since the side wall 35 on an opposite side from the second communicating groove 52 is disposed, loss of capillary action in the direction toward the evaporating portion 11 is prevented. As a result, reduction of capillary action at each of the intersections P1 and P2 can be inhibited, so that the working fluid 2 toward the evaporating portion 11 can be continuously applied capillary action.

Moreover, in this embodiment, the first intersection P1 and the second intersection P2 of the second main flow groove 32 are alternately arranged. In other words, at the first intersection P1 of the second main flow groove 32, capillary action can be applied to the working fluid 2 in the second main flow groove 32 by the side wall 36 on a side of the second communicating groove 52, while at the second intersection P2, capillary action can be applied to the working fluid 2 in the second main flow groove 32 by the side wall 35 on a side of the first communicating groove 51 on an opposite side from the side wall 36. Consequently, capillary action acting on the working fluid 2 in the second main flow groove 32 can be equalized in the width direction (the second direction Y).

In this embodiment, each of the first main flow groove 31, the third main flow groove 33 and the fourth main flow groove 34 has the first intersection P1 and the second intersection P2 in the same manner as the second main flow groove 32. This inhibits reduction of capillary action applied to the working fluid 2 in the first main flow groove 31 to the fourth main flow groove 34.

The working fluid 2 which has reached the evaporating portion 11 receives heat again from the device D to evaporate. In this way, the working fluid 2 circulates in the vapor chamber 1 while executing a change of phase, that is, repeating evaporation and condensation to transfer heat of the device D for releasing. As a result, the device D is cooled.

Incidentally, in this embodiment, as described above, in the second main flow groove 32, the first communicating groove 51 and the second communicating groove 52 are not arranged on the same straight line. Consequently, depending on the attitude of the mobile terminal to which the vapor chamber 1 is installed, there is a case where the second direction Y is more similar to a direction of a gravitational force than the first direction X. With such attitude, if the first communicating groove 51 and the second communicating groove 52 are arranged on the same straight line, it is believed that a part of the working fluid 2 in each of the main flow grooves 31 to 34 is affected by the gravitational force to flow to one side in the second direction Y in each of the communicating grooves 51 to 54, so that the working fluid 2 is shifted to the one side.

However, as in this embodiment, in a case where each of the main flow grooves 31 to 34 includes the first intersection P1 and the second intersection P2, the working fluid 2 is inhibited from linearly flowing to one side in the second direction Y. In other words, the working fluid 2 can move to the evaporating portion 11 through the main flow grooves 31 to 34 while it is directed to the one side in the second direction Y, which inhibits weakening of a flow of the working fluid 2 to the evaporating portion 11. Consequently, the transport function of the working fluid 2 in liquid form can be improved even if the vapor chamber 1 has an attitude in which a gravitational force acts in a direction of inhibiting the transport function of the working fluid 2.

Incidentally, the sealed space 3 is depressurized as described above. Thereby, the lower metallic sheet 10 and the upper metallic sheet 20 receive pressure in a direction of being recessed inwardly from the outside air. Here, in a case where the first communicating groove 51 and the second communicating groove 52 are arranged on the straight line via the second main flow groove 32, an intersection at which the second main flow groove 32, the first communicating groove 51, and the second communicating groove 52 intersect at a right angle is formed. In such a case, along a groove extending in the second direction Y orthogonal to the first direction X, the lower metallic sheet 10 and the upper metallic sheet 20 are recessed inwardly and the corresponding recess traversing the second main flow groove 32 is formed. In this case, a cross-sectional area of a flow path of the second main flow groove 32 is reduced, which can increase flow path resistance of the working fluid 2.

On the other hand, in this embodiment, at each of the first intersection P1 of the second main flow groove 32, the first communicating groove 51 faces each second convex portion 42a. Thereby, even when the lower metallic sheet 10 and the upper metallic sheet 20 are recessed inwardly along the first communicating grooves 51, the corresponding recess is prevented from traversing the second main flow groove 32. This secures the cross-sectional area of the flow path of the second main flow groove 32, and the flow of the working fluid 2 is prevented from being blocked. For example, in a vapor chamber for a mobile terminal requiring a thin body, due to its thinness, inhibiting concave deformation may be difficult. However, even when the vapor chamber 1 according to this embodiment is applied to such vapor chamber for a mobile terminal, according to this embodiment, concave deformation can be effectively inhibited. For example, when the thickness (remained thickness) of a portion of the lower metallic sheet 10 formed with the main flow grooves 31 to 34 and the communicating grooves 51 to 54 is about 50 µm to 150 µm, to inhibit concave deformation, it is contemplated that the staggered arrangement of the first convex portion 41a to the fourth convex portion 44a may be effective. Also, when the oxygen-free copper is used as a material with a good thermal conductivity, inhibition of concave deformation may be difficult due to a low mechanical strength of the material. However, the concave deformation can be effectively inhibited even when the vapor chamber 1 according to this embodiment is made by the oxygen-free copper.

In this way, according to this embodiment, as described above, at the first intersection P1, in the pair of side walls 35, 36 of the second main flow groove 32, the side wall 36 on an opposite side from the first communicating groove 51 can be disposed. Thereby, even when the lower metallic sheet 10 and the upper metallic sheet 20 are recessed inwardly along the first communicating groove 51 due to pressure of the outside air, the corresponding recess is prevented from traversing the second main flow groove 32. In the same manner, at the second intersection P2, in the pair of side walls 35, 36 of the second main flow groove 32, the side wall 35 on an opposite side from the second communicating groove 52 can be disposed. Thereby, even when the lower metallic sheet 10 and the upper metallic sheet 20 are recessed inwardly along the first communicating groove 51 due to pressure of the outside air, the corresponding recess is prevented from traversing the second main flow groove 32. This secures the cross-sectional area of the flow path of the second main flow groove 32, and the flow of the working fluid 2 is prevented from being blocked. As a result, the transport function of the working fluid 2 in liquid form can be improved, and thermal transport efficiency can be improved.

Also, according to this embodiment, the second main flow groove 32 of the liquid flow path portion 30 includes the first intersection P1 at which the first communicating groove 51 faces each second convex portion 42a and the second intersection P2 at which the second communicating groove 52 faces each first convex portion 41a. Thereby, at the first intersection P1, in the pair of side walls 35, 36 of the second main flow groove 32, the side wall 36 on an opposite side from the first communicating groove 51 can be disposed, and at the second intersection P2, the side wall 35 on an opposite side from the second communicating groove 52 is disposed. Accordingly, capillary action can be continuously applied to the working fluid 2 toward the evaporating portion 11. Also, the working fluid 2 in the second main flow groove 32 can be applied capillary action by the side walls 35, 36 disposed at opposite sides from each other at the first intersection P1 and the second intersection P2. Accordingly, capillary action applied to the working fluid 2 in the second main flow groove 32 can be equalized in the second direction Y. This inhibits reduction of the thrust of the working fluid 2 toward the evaporating portion 11 at the intersections P1, P2. As a result, the transport function of the working fluid 2 in liquid form can be improved, and thermal transport efficiency can be improved.

Also, according to this embodiment, the first intersection P1 and the second intersection P2 of the second main flow groove 32 are adjacent to each other. Thereby, capillary action acting on the working fluid 2 in the second main flow groove 32 can be equalized in the width direction.

Also, according to this embodiment, a plurality of first intersections P1 and a plurality of second intersections P2 are alternately arranged. Thereby, capillary action applied to the working fluid 2 in the second main flow groove 32 can be even more equalized.

Also, according to this embodiment, the liquid flow path portion 30 includes the third main flow groove 33, and the third main flow groove 33 includes the first intersection P1 at which the second communicating groove 52 faces each third convex portion 43a and the second intersection P2 at which the third communicating groove 53 faces each second convex portion 42a. Thereby, in the same manner as the above-described second main flow groove 32, even when the lower metallic sheet 10 and the upper metallic sheet 20 are recessed inwardly by the pressure of the outside air, the corresponding recess is prevented from traversing the third main flow groove 33. Moreover, capillary action applied to the working fluid 2 in the third main flow groove 33 can be equalized. This secures the cross-sectional area of the flow path of the third main flow groove 33. In particular, in this embodiment, the first main flow groove 31 and the fourth main flow groove 34 also include similar first intersection P1 and second intersection P2. Accordingly, capillary action applied to the working fluid 2 over the entire of the liquid flow path portion 30 is equalized and the cross-sectional area of the flow path of each of the main flow grooves 31 to 34 can be secured, which can improve transport efficiency of the working fluid 2 even more.

Also, according to this embodiment, the first intersection P1 and the second intersection P2 of the third main flow groove 33 are adjacent to each other, so that one-sided application of capillary action can be inhibited even more. In particular, since the plurality of first intersections P1 and the plurality of second intersections P2 are alternately arranged, capillary action applied to the working fluid 2 in the third main flow groove 33 can be even further equalized.

Also, according to this embodiment, the lower surface 22a of each upper flow path wall portion 22 of the upper metallic sheet 20 abutting the upper surface 13a of each lower flow path wall portion 13 is planar to cover the second main flow groove 32. Thereby, at a transverse section of each of the main flow grooves 31 to 34 and each of the communicating groove 51 to 54, two corner portions 37 in a right angle or an acute angle (see FIG. 7) can be formed, which improves capillary action acting on the working fluid 2 in each of the main flow grooves 31 to 34 and each of the communicating grooves 51 to 54 can be improved.

Also, according to this embodiment, the width w1 of the first main flow groove 31 to the fourth main flow groove 34 is larger than the width w2 of the first convex portions 41a to the fourth convex portions 44a. This increases the ratio of the first to fourth main flow grooves 31 to 34 to the upper surface 13a of each lower flow path wall portion 13. As a result, the transport function of the working fluid 2 in liquid form can be improved.

Further, according to this embodiment, the width w3 of the first communicating groove 51 to the fourth communicating groove 54 is smaller than the width w1 of the first main flow groove 31 to the fourth main flow groove 34. Thereby, during the period that the working fluid 2 in liquid form is transported toward the evaporating portion 11 in each of the main flow grooves 31 to 34, the working fluid 2 is inhibited from flowing to the communicating grooves 51 to 54, which improves the transport function of the working fluid 2. On the other hand, when dryout occurs at any of the main flow grooves 31 to 34, the working fluid 2 can be moved from the main flow grooves 31 to 34 adjacent thereto via the corresponding communicating grooves 51 to 54, and accordingly, the dryout is immediately eliminated to secure the transport function of the working fluid 2.

Additionally, in this embodiment described above, an example in which the entire of the first communicating groove 51 faces each second convex portion 42a at the first intersection P1 of the second main flow groove 32 and the entire of the second communicating groove 52 faces each first convex portion 41a at the second intersection P2 has been explained. However, not limited to this, it is sufficient that a part of the first communicating groove 51 (a partial region of the first communicating groove 51 in the width direction (the first direction X)) faces each second convex portion 42a at the first intersection P1. Moreover, it is sufficient that a part of the second communicating groove 52 faces the first convex portion 41a at the second intersection P2. In other words, a partial overlapping is acceptable unless the first communicating groove 51 and the second communicating groove 52 are overlapped as a whole (unless the first communicating groove 51 and the second communicating groove 52 are arranged on the straight line) seen in the second direction Y. Even in this case, the side wall 36 of the second main flow groove 32 can be arranged at a part of the first intersection P1 in the first direction X and the side wall 35 of the second main flow groove 32 can be arranged at a part of the second intersection P2 in the first direction X. Thereby, at the first intersection P1, loss of capillary action in the direction toward the evaporating portion 11 is prevented. The same is applied to the first intersection P1 and the second intersection P2 in each of the first main flow groove 31, the third main flow groove 33 and the fourth main flow groove 34.

Also, in this embodiment described above, an example in which each of the first main flow groove 31 to the fourth main flow groove 34 includes the first intersection P1 and the second intersection P2 has been explained. However, not limited to this, it is sufficient that the first intersection P1 and the second intersection P2 may be included in at least one of the main flow grooves 31 to 34 of the liquid flow path portion 30.

For example, the liquid flow path portion 30 may have a configuration as shown in FIG. 14. In a form shown in FIG. 14, the second main flow groove 32 and the fourth main flow groove 34 include the first intersection P1 and the second intersection P2 in the same manner as the form shown in FIG. 6. However, the first main flow groove 31 and the third main flow groove 33 do not include the first intersection P1 and the second intersection P2 as in the form shown in FIG. 6. In other words, in the first main flow groove 31, the fourth communicating groove 54 and the first communicating groove 51 extending in the second direction Y are arranged in the straight line, and the third intersection P3 in which the first main flow groove 31, the fourth communicating groove 54 and the first communicating groove 51 intersect at a right angle is formed. In the same manner, also in the third main flow groove 33, the second communicating groove 52 and the third communicating groove 53 extending in the second direction Y are arranged in the straight line, and the third intersection P3 in which the third main flow groove 33, the second communicating groove 52 and the third communicating groove 53 intersect at a right angle is formed. Even in such form, the second main flow groove and the fourth main flow groove 34 include the first intersection P1 and the second intersection P2, which improves the transport function of the working fluid 2 in liquid form in the liquid flow path portion 30.

Also, in this embodiment described above, an example in which the plurality of first intersections P1 and the plurality of second intersections P2 are alternately arranged in each of the main flow grooves 31 to 34 has been explained. However, this is not restrictive. For example, the transport function of the working fluid 2 can be improved as long as one first intersection P1 and one second intersection P2 are included in each of the main flow grooves 31 to 34. Further, while an example in which the first intersection P1 and the second intersection P2 are adjacent to each other in each of the main flow grooves 31 to 34 has been explained, this is not restrictive. For example, in each of the main flow grooves 31 to 34, between the first intersection P1 and the second intersection P2, an intersection in which the communicating grooves 51 to 54 on both sides are arranged in the straight line and the main flow grooves 31 to 34 and the communicating grooves 51 to 54 intersect at a right angle (for example, P3 shown in FIG. 14) may be formed. Even in this case, by the first intersection P1 and the second intersection P2, the transport function of the working fluid 2 in liquid form in the liquid flow path portion 30 can be improved.

Also, in this embodiment described above, an example in which the first main flow groove 31 to the fourth main flow groove and the first communicating groove 51 to the fourth communicating groove 54 intersect at a right angle. However, not limited to this, the first main flow groove 31 to the fourth main flow groove 34 and the first communicating groove 51 to the fourth communicating groove 54 do not necessarily intersect at a right angle as long as they intersect with each other.

Figure 15:
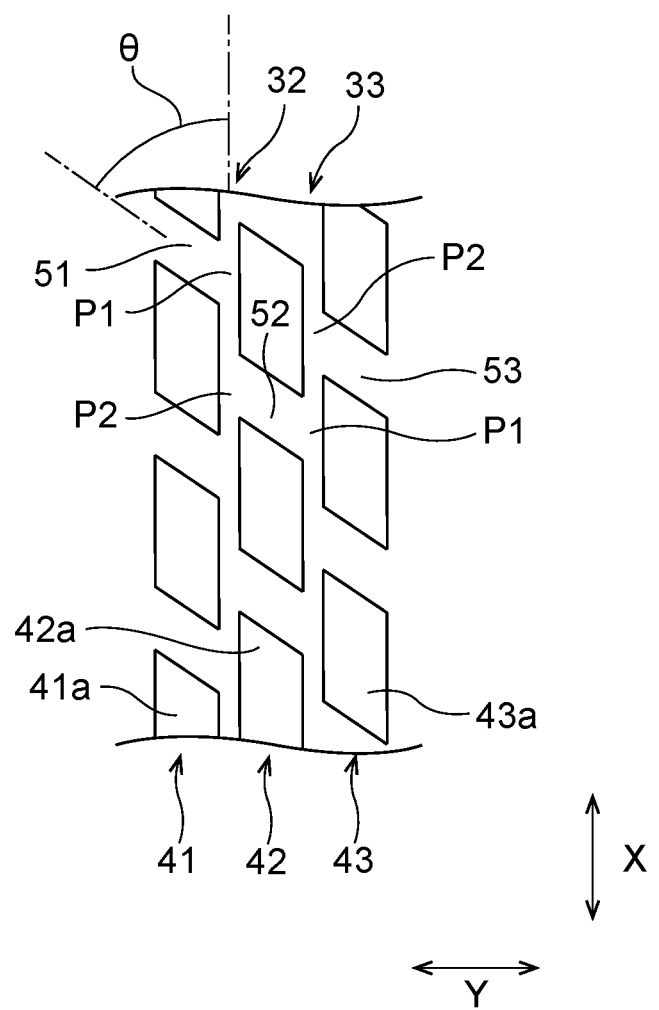
FIG. 15 is a top view showing a modification of a liquid flow path convex portion shown in FIG. 6.

For example, as shown in FIG. 15, a direction of alignment of the communicating grooves 51 to 54 may be inclined to the first direction X and the second direction Y. In this case, an inclining angle θ of the communicating grooves 51 to 54 to the first direction X is arbitrary. In an example shown in FIG. 15, a planar shape of each of the convex portions 41a to 44a is a parallelogram. When such shape is applied to the vapor chamber 1 which is rectangular, four outer edges 1a, 1b (see FIG. 2) constituting the planar outline of the vapor chamber 1 does not intersect at a right angle with the communicating grooves 51 to 54. In such a case, deformation by bending along a line extending in the second direction Y is prevented, which prevents each of the grooves 31 to 34 and 51 to 54 of the liquid flow path portion 30 from being crushed.

Figure 16:
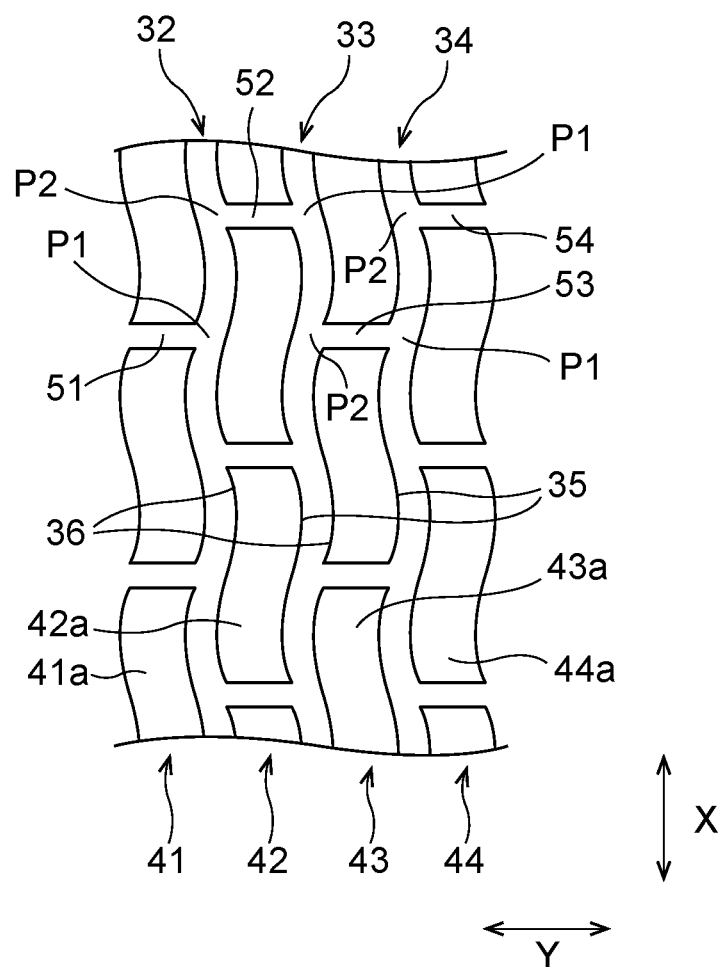
FIG. 16 is a top view showing another modification of the liquid flow path convex portion shown in FIG. 6.

Also, the first to fourth main flow grooves 31 to 34 are not necessarily linearly formed. For example, in FIG. 16, the main flow grooves 31 to 34 are meandering, not linear, and extend in the first direction X in a large sense. More specifically, in the pair of side walls 35, 36 of the main flow groove 31, a curved concave portion and a curved convex portion are alternately arranged to be connected in a smoothly continuing manner. In a case where the main flow grooves 31 to 34 are formed as shown in FIG. 16, a contact area between the working fluid 2 and the convex portions 41a to 44a increases, which improves cooling efficiency of the working fluid 2.

Also, in this embodiment as described above, an example in which the convex portions 41a to 44a are rectangular and arranged in a staggered manner over the entire of each liquid flow path portion 30 has been explained. However, not limited to this, at least a part of the convex portions 41a to 44a may be arranged in a form as shown in FIG. 15 or 16 described above. Further, as for the convex portions 41a to 44a, at least two of the staggered arrangement as shown in FIG. 6, the arrangement of FIG. 15 and the arrangement of FIG. 16 may be combined.

Also, in this embodiment described above, an example in which the first convex portion 41a, the second convex portion 42a, the third convex portion 43a and the fourth convex portion 44a have the same shape has been explained. However, not limited to this, the first convex portion 41a to the fourth convex portion 44a may have different shapes from each other.

Figure 17:
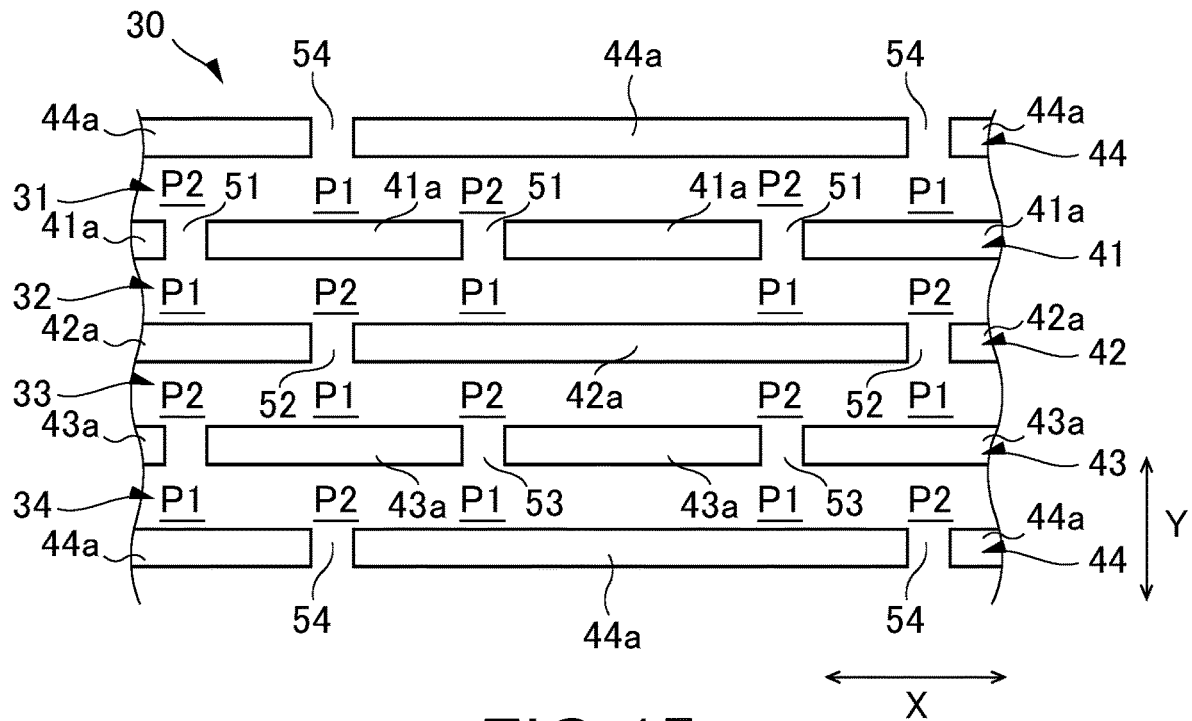
FIG. 17 is a drawing showing another modification of FIG. 6.
Figure 18:
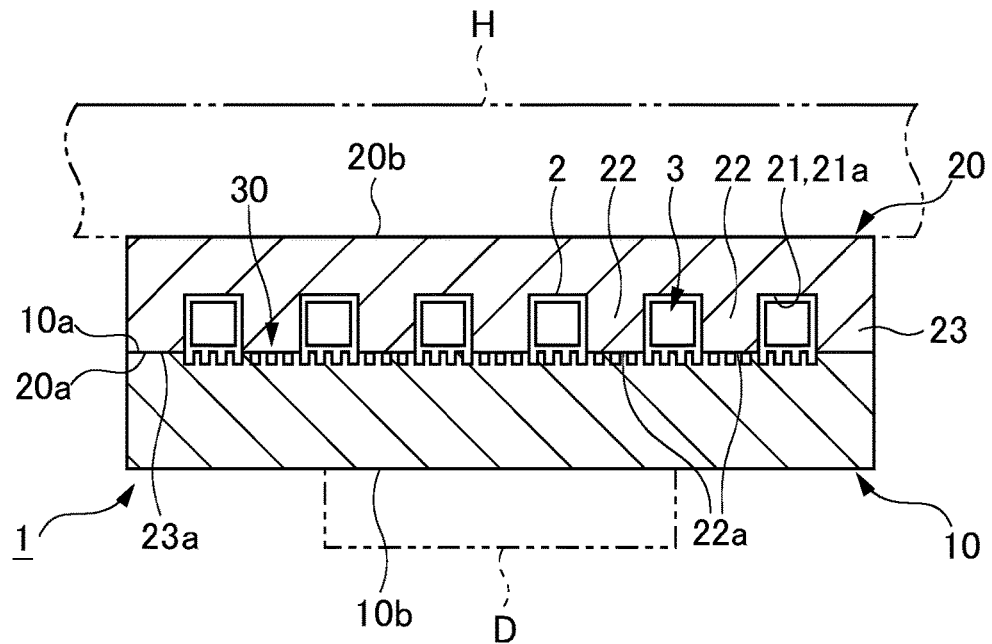
FIG. 18 is a drawing showing another modification of FIG. 3.

For example, as shown in FIG. 17, the length in the first direction X of the second convex portion 42a and the fourth convex portion 44a may be longer than that of the first convex portion 41a and the third convex portion 43a. In a form shown in FIG. 17, in the second main flow groove 32 and the fourth main flow groove 34, two first intersections P1 are interposed between two second intersections P2. In other words, the first intersection P1 and the second intersection P2 are not alternately arranged as shown in FIG. 6. Also, in the first main flow groove 31 and the third main flow groove 33, two second intersections P2 are interposed between two first intersections P1, and the first intersection P1 and the second intersection P2 are not alternately arranged. Also in this case, by the first intersection P1 and the second intersection P2, the transport function of the working fluid 2 in liquid form in the liquid flow path portion 30 can be improved.

Also, in this embodiment described above, an example in which the upper flow path wall portions 22 of the upper metallic sheet 20 extend to be elongated along the first direction X of the vapor chamber 1 has been explained. However, not limited to this, the shape of the upper flow path wall portions 22 is arbitrary. For example, the upper flow path wall portions 22 may be formed as a cylindrical boss. Also in this case, preferably, each upper flow path wall portion 22 is arranged to be overlapped with each lower flow path wall portion 13 in a planar view, and the lower surface 22a of each upper flow path wall portion 22 is allowed to abut the upper surface 13a of each lower flow path wall portion 13.

Also, in this embodiment described above, an example in which the upper metallic sheet 20 has the upper vapor flow path recess 21 has been explained. However, not limited to this, the upper metallic sheet 20 may be formed to be planar as a whole, and does not necessarily have the upper vapor flow path recess 21. In such a case, the lower surface 20a of the upper metallic sheet 20 abuts the upper surface 13a of the each lower flow path wall portion 13 as the second abutting surface, which improves mechanical strength of the vapor chamber 1.

Also, in this embodiment described above, an example in which the lower metallic sheet 10 has the lower vapor flow path recess 12 and the liquid flow path portion 30 has been explained. However, not limited to this, if the upper metallic sheet 20 has the upper vapor flow path recess 21, it is acceptable that the lower metallic sheet 10 does not have the lower vapor flow path recess 12 and the liquid flow path portion 30 is provided in the upper surface 10a of the lower metallic sheet 10. In such a case, as show in FIG. 18, a region formed with the liquid flow path portion 30 of the upper surface 10a may be provided in, in addition to a region facing each upper flow path wall portion 22, a region excluding each upper flow path wall portion 22 in a region facing the upper vapor flow path recess 21. In such a case, the number of main flow grooves 31 to 34 constituting the liquid flow path portion 30 can be increased, which can improve the transport function of the working fluid 2 in liquid form. However, the region formed with the liquid flow path portion 30 is not limited to a form shown in FIG. 18, and is arbitrary as long as the transport function of the working fluid 2 in liquid form can be secured. Also, in the form shown in FIG. 18, the lower surface 22a (an abutting surface) of each upper flow path wall portion 22 of the upper metallic sheet 20 is formed at a partial region of the lower surface 20a of the upper metallic sheet 20 to secure a vapor flow path, and the lower surface 22a of each upper flow path wall portion 22 abuts a part of the region formed with the liquid flow path portion 30 of the upper surface 10a of the lower metallic sheet 10.

Also, in this embodiment described above, an example in which the first main flow groove 31 to the fourth main flow groove 34 include the first intersection P1 and the second intersection P2 has been explained. However, not limited to this, even when each of the main flow grooves 31 to 34 does not include the intersections P1 and P2, as long as the width w1 of the first main flow groove 31 to the fourth main flow groove 34 is larger than the width w2 of each first convex portion 41a to each fourth convex portion 44a, the ratio of the first to fourth main flow grooves 31 to 34 to the upper surface 13a of each lower flow path wall portion 13 can be made larger. Also in such a case, the transport function of the working fluid 2 in liquid form can be improved, which improves thermal transport efficiency.

Second Embodiment

Next, a vapor chamber, an electronic device, a metallic sheet for the vapor chamber and a manufacturing method of the vapor chamber according to a second embodiment of the present invention will be explained using FIGS. 19 to 22.

In the second embodiment as shown in FIGS. 19 to 22, a main difference is that a width of the first to fourth communicating grooves is larger than a width of the first to fourth main flow grooves, and the other configurations are substantially similar to those in the first embodiment shown in FIGS. 1 to 18. Additionally, in FIGS. 19 to 22, the same components as in the first embodiment shown in FIGS. 1 to 18 are applied the same reference numerals, and a detailed explanation thereof is omitted.

Figure 19:
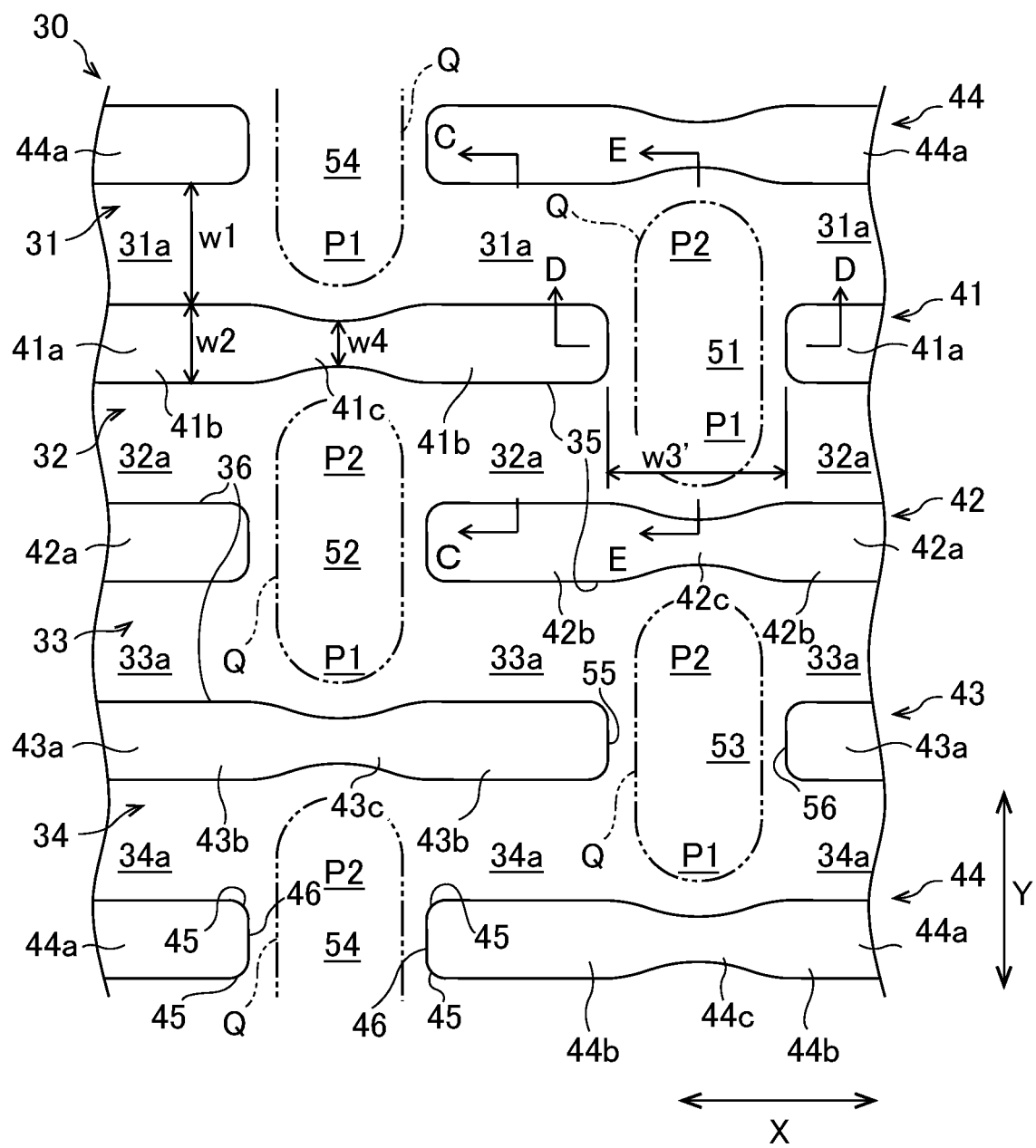
FIG. 19 is an enlarged top view showing a liquid flow path portion a vapor chamber according to a second embodiment of the present invention.
Figure 20:
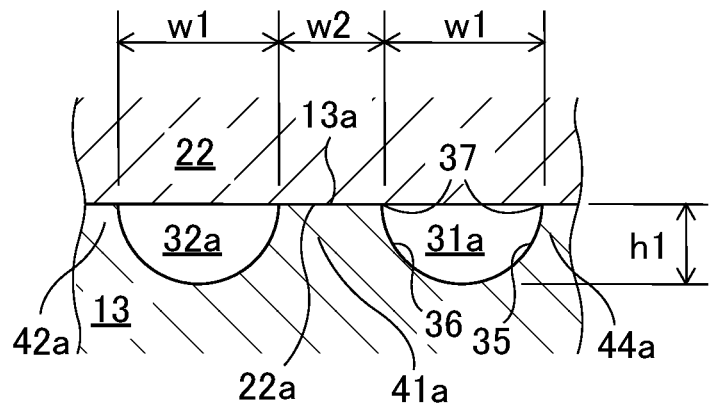
FIG. 20 is a cross-sectional view of FIG. 19 taken along the line C-C with addition of an upper flow path wall portion of the upper metallic sheet.
Figure 21:
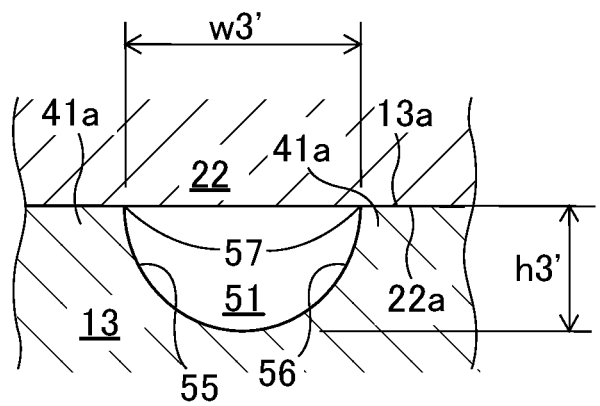
FIG. 21 is a cross-sectional view of FIG. 19 taken along the line D-D with addition of the upper flow path wall portion of the upper metallic sheet.

As shown in FIG. 19, in this embodiment, a width w3' of the first communicating groove 51 to the fourth communicating groove 54 is larger than the width w1 of the first main flow groove 31 to the fourth main flow groove 34 (more specifically, the width of a first main flow groove body portion 31a to a fourth main flow groove body portion 34a which will be described later). The width w3' of the communicating grooves 51 to 54 may be, for example, 40 μm to 300 μm. In this embodiment, as shown in FIGS. 20 and 21, an example in which the shape of a transverse section of each of the main flow grooves 31 to 34 and the shape of a transverse section of each of the communicating grooves 51 to 54 are formed to be curved will be explained. In such a case, the width of grooves 31 to 34 and 51 to 54 is the width of the grooves on the upper surface 13a of each lower flow path wall portion 13. In the same manner, the width of convex portions 41a to 44a which will be described later is the width of the convex portions on the upper surface 13a.

Incidentally, also in this embodiment, the lower surface 22a of each upper flow path wall portion 22 of the upper metallic sheet 20 is formed to be planar. Thereby, the first main flow groove 31 to the fourth main flow groove 34 of the liquid flow path portion 30 are covered by the planar lower surface 22a. In such a case, as shown in FIG. 20, by the pair of side walls 35, 36 extending in the first direction X of the main flow grooves 31 to 34 and the lower surface 22a of each upper flow path wall portion 22, two corner portions 37 in a right angle or an acute angle can be formed, which improves capillary action at the two corner portions 37. In other words, even when the transverse section of each of the first to fourth main flow grooves 31 to 34 is formed to be curved, capillary action can be improved at the corner portions 37.

In the same manner, the first to fourth communicating grooves 51 to 54 of the liquid flow path portion 30 are covered by the planar lower surface 22a. In such a case, as shown in FIG. 21, by the pair of side walls 55, 56 extending in the second direction Y of the first to fourth communicating grooves 51 to 54 and the lower surface 22a of each upper flow path wall portion 22, two corner portions 57 in a right angle or an acute angle can be formed, which improves capillary action at the two corner portions 57. In other words, even when the transverse section of each of the first to fourth communicating grooves 51 to 54 is formed to be curved, capillary action can be improved at the corner portions 57.

Here, the working fluid 2 in liquid form condensed from the vapor passes through the first to fourth communicating grooves 51 to 54 to enter the first to fourth main flow grooves 31 to 34 which will be described later. Consequently, since capillary action of the first to fourth communicating grooves 51 to 54 is improved, the working fluid 2 condensed in liquid form is allowed to smoothly enter the first to fourth main flow grooves 31 to 34. Due to capillary action of the first to fourth communicating grooves 51 to 54, the working fluid 2 condensed in liquid form can smoothly enter not only the first main flow groove 31 at a closer side to the vapor flow path recesses 12, 21, but also the first to fourth main flow grooves 31 to 34 at a farther side from the vapor flow path recesses 12, 21, which improves the transport function of the working fluid 2 condensed in liquid form. Also, since the width w3' of the first to fourth communicating grooves 51 to 54 is larger than the width w1 of the first to fourth main flow grooves 31 to 34, the flow path resistance of the working fluid 2 in the first to fourth communicating grooves 51 to 54 can be reduced, and also in this point, the working fluid 2 condensed in liquid form is allowed to smoothly enter each of the first to fourth main flow grooves 31 to 34. Moreover, the working fluid 2 entering the first to fourth main flow grooves 31 to 34 can be smoothly transported to the evaporating portion 11 due to capillary action of the first to fourth main flow grooves 31 to 34. As a result, as the entire liquid flow path portion 30, the transport function of the working fluid 2 in liquid form can be improved.

Also, both end portions in the first direction X of the first to fourth convex portions 41a to 44a are formed to be rounded in a planar view. In other words, although each of the convex portions 41a to 44a is formed to be rectangular in a large sense, a rounded curved portion 45 is provided at a corner portion thereof. Thereby, a corner portion of each of the convex portions 41a to 44a is formed to be smoothly curved, which reduces the flow path resistance of the working fluid 2 in liquid form. Additionally, such an example is shown that two curved portions 45 are respectively provided at right and left ends in FIG. 19 of the convex portions 41a to 44a, and a linear portion 46 is provided between the two curved portions 45. Consequently, the width w3' of the first to fourth communicating grooves 51 to 54 is the distance between the linear portions 46 adjacent to each other in the first direction X of the convex portions 41a to 44a. The same is applied to a case where no curved portion 45 is provided at each of the convex portions 41a to 44a as shown in FIG. 6. However, the shape of end portions of the convex portions 41a to 44a is not limited to this. For example, instead of providing the linear portion 46 at the right and left ends respectively, the entire end portion may be curved (for example, semicircular.) In such a case, the width w3' of each of the communicating grooves 51 to 54 is the smallest distance between the convex portions 41a to 44a adjacent to each other in the first direction X. Additionally, for clarity of the drawings, in FIG. 19, the curved portions 45 and the linear portions 46 are shown in the fourth convex portions 44a positioned at the bottom as a representative.

As shown in FIGS. 20 and 21, in this embodiment, the width w3' of the first to fourth communicating grooves 51 to 54 is larger than the depth h1 of the first to fourth main flow grooves 31 to 34 (more specifically, the depth of the first to fourth main flow groove body portions 31a to 34a which will be described later.) Here, when the shape of the transverse section of each of the main flow grooves 31 to 34 and the shape of the transverse section of each of the communicating grooves 51 to 54 are formed to be curved as described above, the depth of the grooves 31 to 34 and the depth of the communicating grooves 51 to 54 are the depth at a deepest position in the corresponding groove. The depth h3' of the first to fourth communicating grooves 51 to 54 may be, for example, 10 μm to 250 μm.

Figure 22:
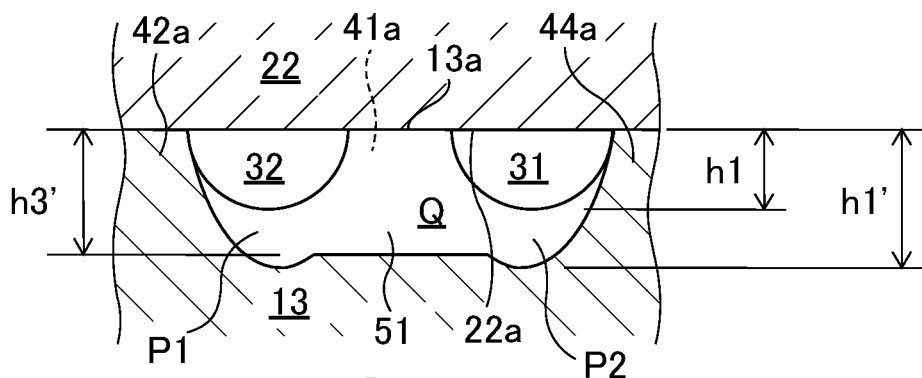
FIG. 22 is a cross-sectional view of FIG. 19 taken along the line E-E with addition of the upper flow path wall portion of the upper metallic sheet.

In this embodiment, as shown in FIG. 22, a depth h1' of the first intersection P1 and the second intersection P2 of the first to fourth main flow grooves 31 to 34 is deeper than the depth h1 of a portion of the main flow grooves 31 to 34 excluding the first intersection P1 and the second intersection P2. In other words, the first to fourth main flow grooves 31 to 34 further include the first to fourth main flow groove body portions 31a to 34a provided between the first intersection P1 and the second intersection P2. Each of the first to fourth main flow groove body portions 31a to 34a is a portion positioned between the convex portions 41a to 44a adjacent to each other, and a portion positioned between the first intersection P1 and the second intersection P2 adjacent to each other. The depth h1' of the first intersection P1 and the second intersection P2 is deeper than the depth h1 of the first to fourth main flow groove body portions 31a to 34a. The depth h1' of the first intersection P1 is a depth at a deepest position in the first intersection P1, and the depth h1' of the second intersection P2 is a depth at a deepest position in the second intersection P2.

More specifically, as shown in FIGS. 19 and 22, the depth h1' of the first intersection P1 and the second intersection P2 of the first main flow groove 31 is deeper than the depth h1 of a portion between the fourth convex portion 44a and the first convex portion 41a of the first main flow groove 31 (the first main flow groove body portion 31a.) In the same manner, the depth h1' of the first intersection P1 and the second intersection P2 of the second main flow groove 32 is deeper than the depth h1 of a portion between the first convex portion 41a and the second convex portion 42a of the second main flow groove 32 (the second main flow groove body portion 32a.) The depth h1' of the first intersection P1 and the second intersection P2 of the third main flow groove 33 is deeper than the depth h1 of a portion between the second convex portion 42a and the third convex portion 43a of the third main flow groove 33 (the third main flow groove body portion 33a.) The depth h1' of the first intersection P1 and the second intersection P2 of the fourth main flow groove 34 is deeper than the depth h1 of a portion between the third convex portion 43a and the fourth convex portion 44a of the fourth main flow groove 34 (the fourth main flow groove body portion 34a.)

Also, the depth h1' of the first intersection P1 and the second intersection P2 of the first to fourth main flow grooves 31 to 34 may be deeper than the depth h3' of the first to fourth communicating grooves 51 to 54. The depth h1' of such first intersection P1 and second intersection P2 may be, for example, 20 μm to 300 μm.

Also, while the first to fourth convex portions 41a to 44a are formed to be rectangular in a large sense as shown in FIG. 19, this shape is different from a planar shape of the first to fourth convex portions 41a to 44a as shown in FIG. 6. In other words, the first to fourth convex portions 41a to 44a include a pair of first to fourth convex end portions 41b to 44b provided at both ends in the first direction X and first to fourth convex intermediate portions 41c to 44c provided between the pair of first to fourth convex end portions 41b to 44b. Among these, a width w4 of the first to fourth convex intermediate portions 41c to 44c is smaller than the width w2 of the first to fourth convex end portions 41b to 44b (corresponding to the width w2 of the first to fourth convex portions 41a to 44a described above.)

More specifically, the width w4 of the first convex intermediate portion 41c is smaller than the width w2 of the first convex end portion 41b, and walls of the first convex portion 41a (that is, the side wall 36 of the first main flow groove 31 and the side wall 35 of the second main flow groove 32) are smoothly curved to be recessed toward an inner portion of the first convex portion 41a. Consequently, the width w4 of the first convex intermediate portion 41c is the smallest distance between two walls. In the same manner, the width w4 of the second convex intermediate portion 42c is smaller than the width w2 of the second convex end portion 42b, and walls of the second convex portion 42a (that is, the side wall 36 of the second main flow groove 32 and the side wall 35 of the third main flow groove 33) are smoothly curved to be recessed toward an inner portion of the second convex portion 42a. The width w4 of the third convex intermediate portion 43c is smaller than the width w2 of the third convex end portion 43b, and walls of the third convex portion 43a (that is, the side wall 36 of the third main flow groove 33 and the side wall 35 of the fourth main flow groove 34) are smoothly curved to be recessed toward an inner portion of the third convex portion 43a. The width w4 of the fourth convex intermediate portion 44c is smaller than the width w2 of the fourth convex end portion 44b, and walls of the fourth convex portion 44a (that is, the side wall 36 of the fourth main flow groove 34 and the side wall 35 of the first main flow groove 31) are smoothly curved to be recessed toward an inner portion of the fourth convex portion 44a. The width w4 of such first to fourth convex intermediate portions 41c to 44c may be, for example, 15 μm to 175 μm.

As described above, the depth h3' of the first to fourth communicating grooves 51 to 54 is deeper than the depth h1 of the first to fourth main flow groove body portions 31a to 34a of the first to fourth main flow grooves 31 to 34, and the depth h1' of the first intersection P1 and the second intersection P2 of the first to fourth main flow grooves 31 to 34 is deeper than the depth h1 of the first to fourth main flow groove body portions 31a to 34a. Thereby, a buffer region Q which is deeper than the depth h1 of the first to fourth main flow groove body portions 31a to 34a is formed at a region from the second intersection P2 through each of the first to fourth communicating grooves 51 to 54 to the first intersection P1. The working fluid 2 in liquid form can be stored in the buffer region Q.

More specifically, for example, the buffer region Q which is deeper than the depth h1 of the first main flow groove body portion 31a and the second main flow groove body portion 32a is formed at a region from the second intersection P2 of the first main flow groove 31 through the first communicating groove 51 to the first intersection P1 of the second main flow groove 32. Typically, each of the main flow grooves 31 to 34 and each of the communicating grooves 51 to 54 of the liquid flow path portion 30 is filled with the working fluid 2 in liquid form. Accordingly, since the depth of the buffer region Q (h1' and h3') is deeper than the depth h1 of the first to fourth main flow groove body portions 31a to 34a, a large quantity of working fluid 2 can be stored in the buffer region Q. As described above, since each of the main flow grooves 31 to 34 and each of the communicating grooves 51 to 54 are filled with the working fluid 2, the working fluid 2 can be stored in the buffer region Q regardless of the attitude of the vapor chamber 1.

In the same manner, the buffer region Q which is deeper than the depth h1 of the second main flow groove body portion 32a and the third main flow groove body portion 33a is formed at a region from the second intersection P2 of the second main flow groove 32 through the second communicating groove 52 to the first intersection P1 of the third main flow groove 33. The buffer region Q which is deeper than the depth h1 of the third main flow groove body portion 33a and the fourth main flow groove body portion 34a is formed at a region from the second intersection P2 of the third main flow groove 33 through the third communicating groove 53 to the first intersection P1 of the fourth main flow groove 34. The buffer region Q which is deeper than the depth h1 of the fourth main flow groove body portion 34a and the first main flow groove body portion 31a is formed at a region from the second intersection P2 of the fourth main flow groove 34 through the fourth communicating groove 54 to the first intersection P1 of the first main flow groove 31.

Additionally, while a large number of first intersections P1 and a large number of second intersections P2 are formed in each liquid flow path portion 30 of the vapor chamber 1, as long as the depth h1' of at least one of the intersections P1, P2 is deeper than the depth h1 of the main flow groove body portions 31a to 34a (or the depth h3' of the communicating grooves 51 to 54), retaining property of the working fluid 2 at the intersections P1, P2 can be improved. Since this retaining property improves as the number of intersections P1, P2 having h1' which is deeper than the depth h1 of the main flow groove body portions 31a to 34a increases, the depth h1' of all the intersections P1, P2 is preferably the same depth. However, the retaining property of the working fluid 2 can be evidently improved even when the depth h1' of a part of the intersections P1, P2 is not deeper than the depth h1 of the main flow groove body portions 31a to 34a due to a production error etc. The same is applied to the depth h3' of the communicating grooves 51 to 54.

Here, a method of confirming the width and the depth of the main flow grooves 31 to 34 and the width and the depth of the communicating grooves 51 to 54 from the vapor chamber 1 in the finished form will be explained. Generally, the main flow grooves 31 to 34 and the communicating grooves 51 to 54 cannot be seen from the outside of the vapor chamber 1. Consequently, such a method can be listed in which the width and the depth of the main flow grooves 31 to 34 and the communicating grooves 51 to 54 are confirmed from a cross-sectional shape obtained by cutting the vapor chamber 1 in the finished form at a desired position.

More specifically, firstly, the vapor chamber 1 is cut by a wire saw into a 10 mm square piece as a sample. After that, the sample is embedded in resin with vacuum degassing such that resin enters the vapor flow path recesses 12, 21 and the liquid flow path portion 30 (the main flow grooves 31 to 34 and the communicating grooves 51 to 54.) Next, trimming process is performed by a diamond knife to obtain a desired cross section. At this time, for example, using a diamond knife of a microtome (an ultra microtome manufactured by Leica microsystems GmbH etc.), trimming process is executed to a portion away from a measured object position by 40 µm. For example, assuming that a pitch of the communicating grooves 51 to 54 is 200 µm, by shaving the communicating grooves 51 to 54 adjacent to the communicating grooves 51 to 54 as a measured object by 160 µm, a portion which is 40 µm away from the communicating grooves 51 to 54 as the measured object can be specified. Next, a trimming-processed cutting surface is shaved to provide a cutting surface for observation. At this time, using a cross section sample manufacturing apparatus (for example, a cross section polisher manufactured by JEOL Ltd.), setting a protruding width of 40 µm, the voltage of 5 kV, and the time of 6 hours, the cutting surface is shaved in ion beam processing. Thereafter, the obtained cutting surface of the sample is observed. At this time, using a scanning electron microscope (for example, a scanning electron microscope manufactured by Carl Zeiss Co., Ltd.), setting the voltage of 5 kV, an operation distance of 3 nm and an observation magnification of 200 to 500 times, the cutting surface is observed. In this way, the width and the depth of the main flow grooves 31 to 34 and the communicating grooves 51 to 54 can be measured. Additionally, an observation magnification standard at the time of shooting is polaroid 545. Also, the above-described method is one example, and an apparatus to be used or the measuring condition etc. can be arbitrarily determined in accordance with the shape and the configuration etc. of the sample.

Incidentally, as described above, the width w3' of the first to fourth communicating grooves 51 to 54 is larger than the width w1 of the first to fourth main flow grooves 31 to 34. Thereby, the buffer region Q is a region which opens wider than the first to fourth main flow groove body portions 31a to 34a. Consequently, in the second half etching step as shown in FIG. 10, more etching liquid enters the buffer region Q than the first to fourth main flow groove body portions 31a to 34a. As a result, erosion by the etching liquid progresses in the buffer region Q, and the depth of the buffer region Q is made deeper. Moreover, in the buffer region Q, a portion corresponding to the first intersection P1 and the second intersection P2 communicates with the first to fourth main flow groove body portions 31a to 34a, so that the etching liquid easily enters this portion than the first to fourth communicating grooves 51 to 54. Thereby, the depth h1' of the first intersection P1 and the second intersection P2 can be deeper than the depth h3' of the first to fourth communicating grooves 51 to 54. In this way, the buffer region Q as shown in FIG. 22 is formed.

Also, because more etching liquid enters the buffer region Q, erosion by the etching liquid progresses at a portion facing the first intersection P1 and the second intersection P2 in walls of the first to fourth convex portions 41a to 44a (the side walls 35, 36 of the first to fourth main flow grooves 31 to 34.) Thereby, the walls of the first to fourth convex portions 41a to 44a are eroded like boring by the etching liquid to produce a smoothly curved shape to be recessed toward the inner portion of each of the convex portions 41a to 44a.

Additionally, in the second half etching step as shown in FIG. 10, as described above, the second resist film is formed to have a pattern on the upper surface 13a of each lower flow path wall portion 13, and the etching liquid enters the resist opening of the second resist film to form the first to fourth main flow grooves 31 to 34 and the first to fourth communicating grooves 51 to 54. Even in a case where this resist opening is formed to be parallel with the first direction X and the second direction Y, since the width w3' of the first to fourth communicating grooves 51 to 54 is larger than the width w1 of the first to fourth main flow grooves 31 to 34, the etching liquid easily enters the buffer region Q. As a result, the above-described buffer region Q can be formed.

In the vapor chamber 1 according to this embodiment, the vapor of the working fluid 2 diffused to the peripheral portion of the vapor chamber 1 is cooled to be condensed. The working fluid 2 condensed in liquid form enters the main flow groove 31 through the first to fourth communicating grooves 51 to 54. Here, as described above, since the width w3' of the first to fourth communicating grooves 51 to 54 is larger than the width w1 of the first to fourth main flow grooves 31 to 34, the flow path resistance of the working fluid 2 in each of the communicating grooves 51 to 54 is reduced. Consequently, the working fluid 2 in liquid form attached to the wall surfaces of each of the vapor flow path recesses 12, 21 passes through each of the communicating grooves 51 to 54 to smoothly enter each of the main flow grooves 31 to 34. In addition, each of the main flow grooves 31 to 34 and each of the communicating grooves 51 to 54 are filled with the working fluid 2 in liquid form.

When the working fluid 2 filled in each of the main flow grooves 31 to 34 is transported toward the evaporating portion 11, a part of the working fluid 2 is directed to the evaporating portion 11 passing through the first intersection P1 and the second intersection P2. In the first intersection P1 and the second intersection P2, the working fluid 2 obtains the thrust toward the evaporating portion 11 mainly from capillary action by the corner portions 37 formed by the side walls 35, 36 of the first to fourth main flow grooves 31 to 34 and the lower surface 22a of each upper flow path wall portion 22.

On the other hand, a part of the working fluid 2 toward the evaporating portion 11 is drawn into the buffer region Q constituted by the first intersection P1 or the second intersection P2 to be stored.

Here, when dryout occurs in the first to fourth main flow groove body portions 31a to 34a, the working fluid 2 stored in the buffer region Q moves toward an occurrence portion of the dryout. More specifically, for example, when the dryout occurs at the first main flow groove body portion 31a, the working fluid 2 moves to an occurrence portion of the dryout by capillary action of the first main flow groove body portion 31a from the buffer region Q which is closest to the occurrence portion of the dryout. Thereby, the occurrence portion of the dryout is filled with the working fluid 2 to eliminate the dryout.

Also, in the first to fourth main flow groove body portions 31a to 34a, when air bubbles are generated in the working fluid 2 in liquid form due to its vapor, the air bubbles are drawn into the buffer region Q at a downstream side (on a side of the evaporating portion 11) to be retained. Since the depth of the buffer regions Q is deeper than the depth h1 of the first to fourth main flow groove body portions 31a to 34a, the air bubbles drawn into the buffer region Q is inhibited from moving from the buffer region Q to the main flow groove body portions 31a to 34a. Consequently, the air bubbles generated in the main flow groove body portions 31a to 34a can be captured by the buffer region Q, which inhibits the flow of the working fluid 2 to the evaporating portion 11 from being blocked due to the air bubbles.

In this way, according to this embodiment, the width w3' of the first to fourth communicating grooves 51 to 54 is larger than the width w1 of the first to fourth main flow grooves 31 to 34. This reduces the flow path resistance of the working fluid 2 in each of the communicating grooves 51 to 54. As a result, the working fluid 2 in liquid form condensed from the vapor is allowed to smoothly enter each of the main flow grooves 31 to 34. In other words, the working fluid 2 can smoothly enter not only the main flow grooves 31 to 34 at a closer side to the vapor flow path recesses 12, 21, but also the main flow grooves 31 to 34 at a farther side from the vapor flow path recesses 12, 21, which improves the transport function of the working fluid 2 condensed in liquid form. As a result, the transport function of the working fluid 2 in liquid form can be improved, and thermal transport efficiency can be improved.

Also, according to this embodiment, the depth h3' of the first to fourth communicating grooves 51 to 54 is deeper than the depth h1 of the first to fourth main flow grooves 31 to 34. Thereby, the buffer region Q which stores the working fluid 2 can be formed at each of the communicating grooves 51 to 54. Consequently, when the dryout occurs at the main flow grooves 31 to 34, the working fluid 2 stored in the buffer region Q can be moved to the occurrence portion of the dryout. This eliminates the dryout, which recovers the transport function of the working fluid 2 in each of the main flow grooves 31 to 34. Also, when air bubbles are generated in the main flow grooves 31 to 34, the air bubbles can be drawn into the buffer region Q to be captured. Also from this point, the transport function of the working fluid 2 in each of the main flow grooves 31 to 34 can be recovered.

Also, according to this embodiment, the depth h1' of the first intersection P1 and the second intersection P2 of the first to fourth main flow grooves 31 to 34 is deeper than the depth h1 of the first to fourth main flow groove body portions 31a to 34a. Thereby, the buffer region Q can extend to the first intersection P1 and the second intersection P2. Consequently, the storage volume of the working fluid 2 in the buffer region Q can be increased, and the dryout can be eliminated more easily.

Also, according to this embodiment, the depth h1' of the first intersection P1 and the second intersection P2 of the first to fourth main flow grooves 31 to 34 is deeper than the depth h3' of the first to fourth communicating grooves 51 to 54. Thereby, in the buffer region Q, the depth of the buffer region Q can be made deeper on a side close to the occurrence portion of the dryout. Consequently, the working fluid 2 stored can be smoothly moved to the occurrence portion of the dryout, which eliminates the dryout more easily.

Also, according to this embodiment, the width w4 of the first to fourth convex intermediate portions 41c to 44c of the first to fourth convex portions 41a to 44a is smaller than the width w2 of the first to fourth convex end portions 41b to 44b. Thereby, a plain area of the first intersection P1 and the second intersection P2 can be increased. Consequently, the storage volume of the working fluid 2 in the buffer region Q can be increased, which Also, according to this embodiment, the rounded curved portion 45 is provided at corner portions of each of the convex portions 41a to 44a. Thereby, the corner portion of each of the convex portions 41a to 44a can be formed to be smoothly curved, which eliminates the flow path resistance of the working fluid 2 in liquid form.

Third Embodiment

Next, a vapor chamber, a metallic sheet for the vapor chamber and a manufacturing method of the vapor chamber according to a third embodiment of the present invention will be explained using FIGS. 23 to 25.

Figure 23:
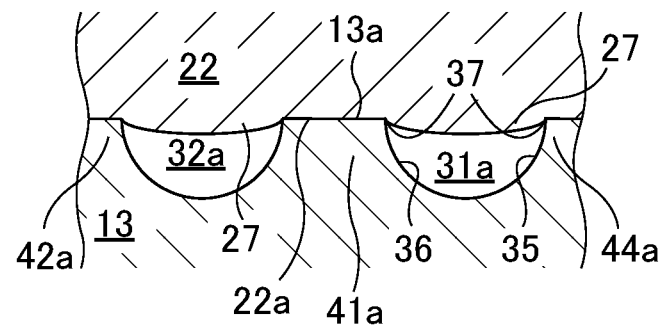
FIG. 23 is an enlarged cross-sectional view showing a main flow groove convex portion in a vapor chamber according to a third embodiment of the present invention, corresponding to FIG. 20.
Figure 24:
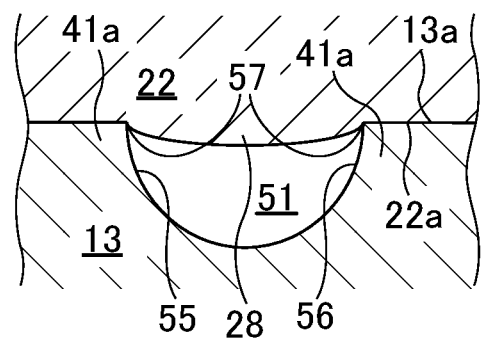
FIG. 24 is an enlarged cross-sectional view showing a communicating groove convex portion in the vapor chamber according to the third embodiment of the present invention, corresponding to FIG. 21.
Figure 25:
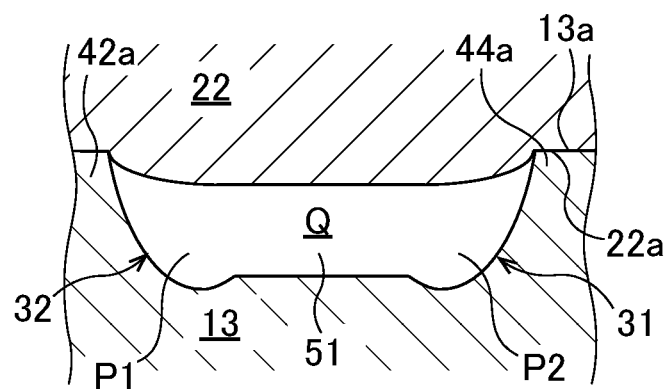
FIG. 25 is an enlarged cross-sectional view showing a communicating groove convex portion in the vapor chamber according to the third embodiment of the present invention, corresponding to FIG. 22.

In the third embodiment shown in FIGS. 23 to 25, a main difference is that a main flow groove convex portion protrudes in the first to fourth main flow grooves, and a communicating groove convex portion protrudes in the first to fourth communicating grooves, and the other configurations are substantially the same as in the second embodiment as shown in FIGS. 19 to 22. Additionally, in FIGS. 23 to 25, the same components as those in the second embodiment as shown in FIGS. 19 to 22 are applied the same reference numerals, and a detailed explanation thereof is omitted.

As shown in FIG. 23, in this embodiment, the upper metallic sheet 20 includes a plurality of main flow groove convex portions 27 provided in the lower surface 20a. Each of the main flow groove convex portions 27 protrudes to the corresponding one of the main flow grooves 31 to 34 of the lower metallic sheet 10 from the lower surface 20a. A lower end of each main flow groove convex portion 27 is separated from a bottom portion of the main flow grooves 31 to 34, so that the flow path of the working fluid 2 is secured. Also, each main flow groove convex portion 27 is formed to extend in the first direction X along the corresponding one of the main flow grooves 31 to 34.

A cross section of each main flow groove convex portion 27 is formed to be curved. Also, a lateral edge of each main flow groove convex portion 27 contacts or is close to the side walls 35, 36 of the first to fourth main flow grooves 31 to 34. Thereby, the corner portions 37 formed by the side walls 35, 36 of the first to fourth main flow grooves 31 to 34 and the lower surface 22a of each upper flow path wall portion 22 are formed to be wedge-shaped (or like an acute angle.) In this way, a cross section of a flow path defined by the main flow grooves 31 to 34 and the main flow groove convex portions 27 (a cross section of a flow path in the second direction Y) is formed in a crescent shape as shown in FIG. 23.

Also, as shown in FIGS. 24 and 25, in this embodiment, the upper metallic sheet 20 includes a plurality of communicating groove convex portions 28 provided in the lower surface 20a. Each communicating groove convex portion 28 protrudes to the corresponding one of the communicating groove 51 to 54 of the lower metallic sheet 10 from the lower surface 20a. A lower end of each communicating groove convex portion 28 is separated from a bottom portion of the communicating grooves 51 to 54, so that the flow path of the working fluid 2 is secured. Also, each communicating groove convex portion 28 is formed to extend in the second direction Y along the corresponding one of the communicating grooves 51 to 54. At the first intersections P1 and the second intersections P2 of the first to fourth main flow grooves 31 to 34, the main flow groove convex portions 27 and the communicating groove convex portions 28 described above intersect to form a T shape.

A cross section of each communicating groove convex portion 28 is formed to be curved in the same manner as each main flow groove convex portion 27. Also, a lateral edge of each communicating groove convex portion 28 contacts or is close to the pair of side walls 55, 56 (see FIG. 19) extending in the second direction Y of the first to fourth communicating grooves 51 to 54. Thereby, the corner portions 57 formed by the side walls 55, 56 of the first to fourth communicating grooves 51 to 54 and the lower surface 22a of each upper flow path wall portion 22 is formed to be wedge-shaped (or like an acute angle.) In this way, a cross section of a flow path defined by the communicating grooves 51 to 54 and the communicating groove convex portions 28 (a cross section of a flow path in the first direction X) is formed in a crescent shape as shown in FIG. 24. Also, the cross section of the flow path in the second direction Y is formed in an elongated crescent shape as shown in FIG. 25, because it is formed such that the cross section of the flow path in the second direction Y of the first to fourth communicating grooves 51 to 54 is interposed between the cross section of the flow path of the main flow grooves 31 to 34 as shown in FIG. 23. Additionally, in FIG. 19, for clarity of the drawings, the reference numerals 55, 56 are applied to the side walls only in the third communicating groove 53. The side walls 55, 56 correspond to the above-described linear portion 46 of the convex portions 41a to 44a.

The main flow groove convex portions 27 and the communicating groove convex portions 28 are formed, for example, by half etching of the upper metallic sheet 20 to form the upper flow path wall portions 22 etc., and then press working of the upper metallic sheet 20 alone. Alternatively, in the permanent joint step as shown in FIG. 12, a welding pressure to be applied to the lower metallic sheet 10 and the upper metallic sheet 20 is increased to form the main flow groove convex portions 27 and the communicating groove convex portions 28. In other words, by increasing the welding pressure, a part of each upper flow path wall portion 22 of the upper metallic sheet 20 can be inserted into the first to fourth main flow grooves 31 to 34 and the first to fourth communicating grooves 51 to 54. As a result, the main flow groove convex portions 27 and the communicating groove convex portions 28, having a curved cross section, can be formed.

In this way, according to this embodiment, each main flow groove convex portion 27 protrudes to the corresponding one of the main flow grooves 31 to 34 of the lower metallic sheet 10 from the lower surface 20a of the upper metallic sheet 20. Thereby, the corner portions 37 formed by the side walls 35, 36 of the first to fourth main flow grooves 31 to 34 and the lower surface 22a of each upper flow path wall portion 22 can be formed as a minute space defined by the side walls 35, 36 of the first to fourth main flow grooves 31 to 34 and the main flow groove convex portions 27. This improves capillary action at the corner portions 37. As a result, the transport function of the working fluid 2 in liquid form in each of the main flow grooves 31 to 34 can be improved, so that thermal transport efficiency can be improved. In particular, even when the first intersection P1 and the second intersection P2 of each of the main flow grooves 31 to 34 are configured as the buffer region Q as shown in FIG. 19, a high thrust toward the evaporating portion 11 can be applied to the working fluid 2 at the first intersection P1 and the second intersection P2 due to capillary action by the main flow groove convex portions 27, which improves the transport function of the working fluid 2 effectively.

Also, according to this embodiment, a cross section of the main flow groove convex portions 27 is formed to be curved. Thereby, the corner portions 37 can have a shape like an end of the crescent shape. Consequently, capillary action at the corner portions 37 can be further improved.

Also, according to this embodiment, each communicating groove convex portion 28 protrudes to the corresponding one of the communicating grooves 51 to 54 of the lower metallic sheet 10 from the lower surface 20a of the upper metallic sheet 20. Thereby, the corner portions 57 formed by the side walls 55, 56 of the first to fourth communicating grooves 51 to 54 and the lower surface 22a of each upper flow path wall portion 22 can be formed as a minute space defined by the side walls 55, 56 of the first to fourth communicating grooves 51 to 54 and the communicating groove convex portions 28. This improves capillary action at the corner portions 57.

Here, the working fluid 2 in liquid form condensed from the vapor passes through the first to fourth communicating grooves 51 to 54 to enter the first to fourth main flow grooves 31 to 34 as described above. Consequently, since capillary action of the first to fourth communicating grooves 51 to 54 is improved, the working fluid 2 condensed in liquid form is allowed to smoothly enter the first to fourth main flow grooves 31 to 34. Due to capillary action of the first to fourth communicating grooves 51 to 54, the working fluid 2 condensed in liquid form can smoothly enter not only the first to fourth main flow grooves 31 to 34 at a closer side to the vapor flow path recesses 12, 21, but also the first to fourth main flow grooves 31 to 34 at a farther side from the vapor flow path recesses 12, 21, which improves the transport function of the working fluid 2 condensed in liquid form. Also, since the width w3' of the first to fourth communicating grooves 51 to 54 is larger than the width w1 of the first to fourth main flow grooves 31 to 34, the flow path resistance of the working fluid 2 in the first to fourth communicating grooves 51 to 54 can be reduced, and also in this point, the working fluid 2 condensed in liquid form is allowed to smoothly enter each of the first to fourth main flow grooves 31 to 34. Moreover, the working fluid 2 entering the first to fourth main flow grooves 31 to 34 can be smoothly transported to the evaporating portion 11 due to capillary action of the first to fourth main flow grooves 31 to 34. As a result, as the entire liquid flow path portion 30, the transport function of the working fluid 2 in liquid form can be improved. Also, as described above, since capillary action of the first to fourth communicating grooves 51 to 54 is improved, when the dryout occurs, the working fluid 2 can reciprocate among the first to fourth main flow grooves 31 to 34 due to the capillary action of the first to fourth communicating grooves 51 to 54, so that the dryout can be eliminated.

Also, according to this embodiment, a cross section of the communicating groove convex portions 28 is formed to be curved. Thereby, the corner portions 57 can have a shape like an end of the crescent shape. Consequently, capillary action at the corner portions 57 can be further improved.

Additionally, in this embodiment described above, an example in which the cross section of the first to fourth main flow grooves 31 to 34 and the cross section of the first to fourth communicating grooves 51 to 54 are formed to be curved has been explained. However, not limited to this, the cross section of the first to fourth main flow grooves 31 to 34 and the cross section of the first to fourth communicating grooves 51 to 54 may be formed to be rectangular as shown in FIG. 7. Also in this case, capillary action in the corner portions 37, 57 can be improved, so that the transport function of the working fluid 2 in liquid form in the first to fourth main flow grooves 31 to 34 and the first to fourth communicating grooves 51 to 54 can be improved. To make the cross section rectangular, the main flow grooves 31 to 34 and the communicating grooves 51 to 54 are preferably formed by press working or cutting work.

Also, in this embodiment described above, an example in which the width w3' of the first to fourth communicating grooves 51 to 54 is larger than the width w1 of the first to fourth main flow grooves 31 to 34 has been explained. However, not limited to this, as shown in FIG. 6, the width w3' of each of the communicating grooves 51 to 54 is not necessarily larger than the width w1 of the each of the main flow grooves 31 to 34. In other words, an effect of improving the transport function of the working fluid 2 in liquid form in the main flow grooves 31 to 34 with improvement of capillary action of the first to fourth main flow grooves 31 to 34 by the main flow groove convex portions 27 can be exerted regardless of the magnitude relationship between the width w3' of the communicating grooves 51 to 54 and the width w1 of the main flow grooves 31 to 34. In the same manner, an effect of improving the transport function of the working fluid 2 condensed in liquid form with improvement of capillary action of the first to fourth communicating grooves 51 to 54 by the communicating groove convex portions 28 can be exerted regardless of the magnitude relationship between the width w3' of the communicating grooves 51 to 54 and the width w1 of the main flow grooves 31 to 34.

The present invention is not directly limited to the above embodiments and modifications, and in an implementation phase, can be embodied with modification of constituent elements without departing the gist of the present invention. Also, various inventions can be made by an appropriate combination of a plurality of constituent elements disclosed in the above embodiments and modifications. Several constituent elements may be deleted from all the constituent elements shown in the embodiments and modifications. Moreover, in each of the above embodiments and modifications, the configuration of the lower metallic sheet 10 may be replaced with the configuration of the upper metallic sheet 20.

The invention claimed is:

1. A metallic sheet for a vapor chamber, the vapor chamber including a sealed space in which a working fluid is enclosed, the sealed space including a vapor flow path portion through which a vapor of the working fluid passes and a liquid flow path portion through which the working fluid in liquid form passes, the metallic sheet for the vapor chamber comprising:
a first surface; and
a second surface on an opposite side from the first surface,
wherein the liquid flow path portion is on the first surface,
the liquid flow path portion includes a first main flow groove, a second main flow groove and a third main flow groove, each of which extends in a first direction and through which the working fluid in liquid form passes,
the first main flow groove, the second main flow groove and the third main flow groove are arranged in this order in a second direction orthogonal to the first direction,
a first convex array which
includes a plurality of first convex portions arranged in the first direction and separated via a first communicating groove, and
is between the first main flow groove and the second main flow groove,
a second convex array which
includes a plurality of second convex portions arranged in the first direction and separated via a second communicating groove, and
is between the second main flow groove and the third main flow groove,
the first communicating groove allows communication between the first main flow groove and the second main flow groove,
the second communicating groove allows communication between the second main flow groove and the third main flow groove, and
the second main flow groove includes a first intersection at which at least a part of the first communicating groove faces one of the second convex portions and a second intersection at which at least a part of the second communicating groove faces one of the first convex portions.

2. A vapor chamber in which a working fluid is enclosed, the vapor chamber comprising:
a first metallic sheet including the metallic sheet for the vapor chamber according to claim 1;
a second metallic sheet on the first metallic sheet; and
the sealed space between the first metallic sheet and the second metallic sheet,
wherein the first surface is a surface of the first metallic sheet on a side of the second metallic sheet.

3. The metallic sheet for the vapor chamber according to claim 1, wherein the first intersection and the second intersection of the second main flow groove are adjacent to each other.

4. The metallic sheet for the vapor chamber according to claim 1, wherein the second main flow groove includes a plurality of the first intersections and a plurality of the second intersections, and
the plurality of the first intersection and the plurality of the second intersection of the second main flow groove are alternately arranged.

5. The metallic sheet for the vapor chamber according to claim 1, wherein the liquid flow path portion further includes a fourth main flow groove which extends in the first direction and through which the working fluid in liquid form passes,
- the fourth main flow groove is arranged on an opposite side from the second main flow groove to the third main flow groove,
- a third convex array
  - includes a plurality of third convex portions arranged in the first direction and separated via a third communicating groove, and
  - is between the third main flow groove and the fourth main flow groove,
- the third communicating groove allows communication between the third main flow groove and the fourth main flow groove, and
- the third main flow groove includes a third intersection at which at least a part of the second communicating groove faces one of the third convex portions and a fourth intersection at which at least a part of the third communicating groove faces one of the second convex portions.

6. The metallic sheet for the vapor chamber according to claim 5, wherein the third intersection and the fourth intersection of the third main flow groove are adjacent to each other.

7. The metallic sheet for the vapor chamber according to claim 5, wherein the third main flow groove includes a plurality of the third intersections and a plurality of the fourth intersections, and
- the plurality of the third intersections and the plurality of the fourth intersections of the third main flow groove are alternately arranged.

8. The metallic sheet for the vapor chamber according to claim 1, wherein a width of the second main flow groove is larger than a width of the first convex portions and a width of the second convex portions.

9. The metallic sheet for the vapor chamber according to claim 1, wherein a width of the first communicating groove is larger than a width of the first main flow groove and the width of the second main flow groove, and
- a width of the second communicating groove is larger than the width of the second main flow groove and a width of the third main flow groove.

10. The metallic sheet for the vapor chamber according to claim 9, wherein a depth of the first communicating groove is deeper than a depth of the first main flow groove and a depth of the second main flow groove, and
- a depth of the second communicating groove is deeper than the depth of the second main flow groove and a depth of the third main flow groove.

11. The metallic sheet for the vapor chamber according to claim 10, wherein a depth of the first intersection and a depth of the second intersection of the second main flow groove are deeper than a depth of a portion between the first convex portions and the second convex portions adjacent to each other in the second main flow groove.

12. The metallic sheet for the vapor chamber according to claim 11, wherein the depth of the first intersection and the depth of the second intersection of the second main flow groove are deeper than the depth of the first communicating groove and the depth of the second communicating groove.

13. The metallic sheet for the vapor chamber according to claim 9, wherein each first convex portion includes a pair of first convex end portions at both end portions in the first direction and a first convex intermediate portion between the pair of first convex end portions, and
- a width of the first convex intermediate portion is smaller than a width of the first convex end portions.

14. The metallic sheet for the vapor chamber according to claim 1, wherein a rounded curved portion is at a corner portion of each first convex portion.

15. An electronic device comprising:
- a housing;
- a device housed in the housing; and
- the vapor chamber according to claim 2, wherein the vapor chamber is thermally contacted to the device.

16. A manufacturing method of a vapor chamber including a sealed space which is provided between a first metallic sheet and a second metallic sheet and in which a working fluid is enclosed, the sealed space including a vapor flow path portion through which a vapor of the working fluid passes and a liquid flow path portion through which the working fluid in liquid form passes, the manufacturing method for vapor chamber comprising:
- half-etching in which a surface of the first metallic sheet on a side of the second metallic sheet is half-etched to form the liquid flow path portion;
- joining the first metallic sheet and the second metallic sheet such that the sealed space is formed between the first metallic sheet and the second metallic sheet; and
- enclosing the working fluid in the sealed space,
- wherein the liquid flow path portion includes a first main flow groove, a second main flow groove and a third main flow groove, each of which extends in a first direction and through which the working fluid in liquid form passes,
- the first main flow groove, the second main flow groove and the third main flow groove are arranged in this order in a second direction orthogonal to the first direction,
- a first convex array which
  - includes a plurality of first convex portions arranged in the first direction and separated via a first communicating groove, and
  - is between the first main flow groove and the second main flow groove,
- a second convex array which
  - includes a plurality of second convex portions arranged in the first direction and separated via a second communicating groove, and
  - is between the second main flow groove and the third main flow groove,
- the first communicating groove allows communication between the first main flow groove and the second main flow groove,
- the second communicating groove allows communication between the second main flow groove and the third main flow groove, and
- the second main flow groove includes a first intersection at which at least a part of the first communicating groove faces one of the second convex portions and a second intersection at which at least a part of the second communicating groove faces one of the first convex portions.

* * * * *